(12) United States Patent
Bhattacharya

(10) Patent No.: US 6,381,717 B1
(45) Date of Patent: Apr. 30, 2002

(54) SNOOPY TEST ACCESS PORT ARCHITECTURE FOR ELECTRONIC CIRCUITS INCLUDING EMBEDDED CORE HAVING TEST ACCESS PORT WITH INSTRUCTION DRIVEN WAKE-UP

(75) Inventor: Debashis Bhattacharya, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/298,801

(22) Filed: Apr. 23, 1999

Related U.S. Application Data
(60) Provisional application No. 60/082,992, filed on Apr. 24, 1998.

(51) Int. Cl.$^7$ ................................................ G01R 31/28
(52) U.S. Cl. .................... 714/724; 714/734; 712/227
(58) Field of Search .................... 712/38, 227; 714/724, 714/726, 727, 729, 734

(56) References Cited

U.S. PATENT DOCUMENTS

| | | | |
|---|---|---|---|
| 5,774,476 A | * | 6/1998 | Pressly et al. ............... 714/726 |
| 5,889,788 A | * | 3/1999 | Pressly et al. ............... 714/726 |
| 5,991,898 A | * | 11/1999 | Rajski et al. ................. 714/30 |
| 6,324,662 B1 | * | 11/2001 | Haroun et al. ............... 714/724 |

OTHER PUBLICATIONS

Bhattacharaya Instruction–driven wake–up mechanism for Snoopy TAP Controller. IEEE 4/99.*

* cited by examiner

Primary Examiner—Larry D. Donaghue
(74) Attorney, Agent, or Firm—Robert D. Marshall, Jr.; W. James Brady, III; Frederick J. Telecky, Jr.

(57) ABSTRACT

This invention is a testing technique for an electronic circuit such as an integrated circuit. The electronic circuit includes a JTAG test access port and at least one testable embedded core circuit having its own JTAG compliant second test access port. A test access port controller and a programmable switch control testing of the electronic circuit. An internal state in the test access port controller, such as bits in a data register, controls the switch state of the programmable switch. When an embedded core circuit is connected for test, the test access port controller remains responsive to the first test access port and operates in a set of snoopy states corresponding to the state of the embedded core circuit under test. The test access port controller can regain control of the test access port and disconnect all of the embedded core circuits when in snoopy states upon detection of a wake-up instruction loaded into a snoopy instruction register during a snoopy state corresponding to an instruction input state. Alternatively, a count of instruction bits more than the most bits for instruction input for any embedded core can trigger the wake-up function.

16 Claims, 14 Drawing Sheets

SNOOPY TEST ACCESS PORT ARCHITECTURE FOR ELECTRONIC CIRCUITS INCLUDING EMBEDDED CORE HAVING TEST ACCESS PORT WITH INSTRUCTION DRIVEN WAKE-UP

CLAIM OF PRIORITY

This application claims priority from U.S. Provisional Application No. 60/082,992 filed Apr. 24, 1998.

CROSS REFERENCE TO RELATED APPLICATIONS

This application is related to the following contemporaneously filed U.S. Patent Applications:

U.S. patent application Ser. No. 09/298,138 entitled "SNOOPY TEST ACCESS PORT ARCHITECTURE FOR ELECTRONIC CIRCUITS INCLUDING EMBEDDED CORE WITH BUILT-IN TEST ACCESS PORT";

U.S. patent application Ser. No. 09/298,018 entitled "HIERARCHICAL TEST ACCESS PORT ARCHITECTURE FOR ELECTRONIC CIRCUITS INCLUDING EMBEDDED CORE HAVING BUILT-IN TEST ACCESS PORT".

TECHNICAL FIELD OF THE INVENTION

The technical field of this invention is test access ports for integrated circuits and more particularly a manner to integrate core logic modules each having a test access port.

BACKGROUND OF THE INVENTION

Continuous decrease in feature size of transistors has led to the recent trend of core-based design. Today's integrated circuit (IC) becomes tomorrow's integratable core. Today's printed circuit board becomes tomorrow's IC. This decrease in feature size leads to the availability of unprecedented number of transistors on an integrated circuit. Current technology trends lead to projections of further rise in the number of transistors that may be integrated into a single IC. This expected trend in IC technology is leading to a re-prioritization of design issues. The traditional concern of gate/transistor count is becoming relatively less important. Issues like re-usability of existing designs, and minimization of design cycle time, are increasing continuously in importance. A major design problem for large integrated circuits is testability. Moreover, both the recurring and non-recurring test costs of such complex products now constitute a significant fraction of the total cost of the product. It is now likely that a single large IC will employ one or more preexisting cores. Currently the most widely accepted test standard for integrated circuits is IEEE Standard 1149.1, also known as JTAG. This standard was created with the primary goal of alleviating board-test problem via Test Access Ports (TAPs). The JTAG standard cannot be directly used in IC's containing cores which already include Test Access Ports. At the same time, widespread acceptance of JTAG in the electronics and semiconductor industry requires current and future IC's to be fully compliant with this standard. Thus there is a great need to develop a test access mechanism that allows embedded cores and non-core logic in an IC to be accessed via a well-defined JTAG interface.

Recently, some solutions have been proposed to address this problem that either violate the JTAG standard, or require modification of the TAP in existing cores, or follow a completely different Built-In Self Test (BIST) based technique to testing embedded cores, without addressing the issue of JTAG compliant test access to the embedded cores.

SUMMARY OF THE INVENTION

This invention is a testing technique for an electronic circuit such as an integrated circuit. The electronic circuit includes a first test access port, preferably compliant with the IEEE Standard 1149.1 commonly known as JTAG. The electronic circuit includes at least one testable embedded core circuit having its own JTAG compliant second test access port. A test access port controller and a programmable switch control testing of the electronic circuit. The test access port controller is preferably also JTAG compliant. An internal state in the test access port controller, such as bits in a data register, controls the switch state of the programmable switch. The programmable switch is controlled to selectively connect the first test access port to the embedded core circuits. When an embedded core circuit is connected for test, the test access port controller remains responsive to the first test access port and operates in a set of snoopy states corresponding to the state of the embedded core circuit under test. The test access port controller can control the programmable switch to regain control of the first test access port and disconnect all of the embedded core circuits when in snoopy states. This may occur upon detection of a wake-up instruction loaded into a snoopy instruction register during a snoopy state corresponding to an instruction input state. Alternatively, a count of instruction bits more than the most bits for instruction input for any embedded core can trigger the wake-up function.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
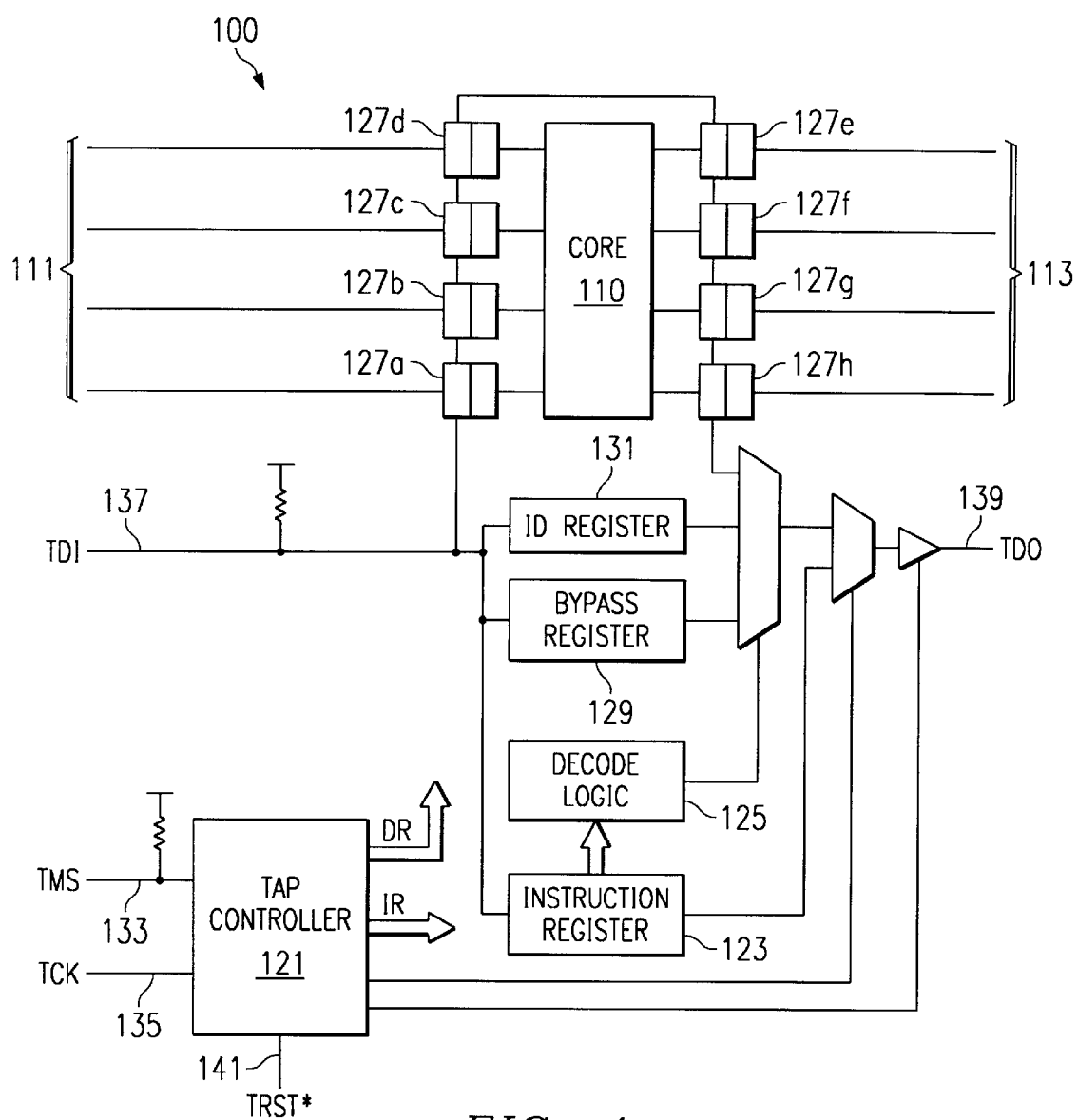
FIG. 1 illustrates the features of the prior art JTAG test access port as connected to a circuit under test.

FIG. 1 illustrates the basic parts of a JTAG interface, which specifies a test architecture for exemplary integrated circuit 100. Integrated circuit 100 includes core logic 110 and various normal input/output pins 111 and 113. This standard permits internal scan, boundary scan, built-in self-test (BIST), and vendor-specific design-for-testability features all to be accessed and controlled via the same test access port (TAP). The overall structure of the TAP includes four essential parts: a TAP controller 121; an instruction register (IR) 123, which can be loaded with instructions related to various test actions; a decode logic 125 which decodes the contents of instruction register 123 to generate appropriate control signals; and a set of other registers called data registers. The data registers must include a boundary scan register (BSR). In FIG. 1 boundary scan register 127 is illustrated as parts 127a to 127h, which connect to respective input/output lines 111 and 113. FIG. 1 further illustrates two data registers bypass register 129 and ID register 131. The JTAG standard permits circuit specific data registers which commonly include various registers in the circuit under test (CUT).

The TAP controller 121 is a 1-input synchronous sequential circuit whose operation is controlled via two pins. These two pins are: test mode select TMS 133; and test clock TCK 135. The test mode select pin 133 serves as the sole input to TAP controller 121. The TAP specification requires two other pins: test data input TDI 137; and test data output TDO 139. The test data input pin 137 and the test data output pin 139 are used to serially shift into and out of various registers including circuit specific registers. The TAP specification permits an optional test reset pin TRST* 141. The test reset pin 141 facilitates resetting of the TAP controller 121. In general, data is loaded into the various data registers via test data input pin 137 and instructions are loaded into instruction register 123 also via test data input pin 137. These instructions are decoded via decoder logic 125 to enable various actions like a scan test, BIST, emulation, etc. Results of the tests may be read out of the data registers via test data output pin 139.

Figure 2:
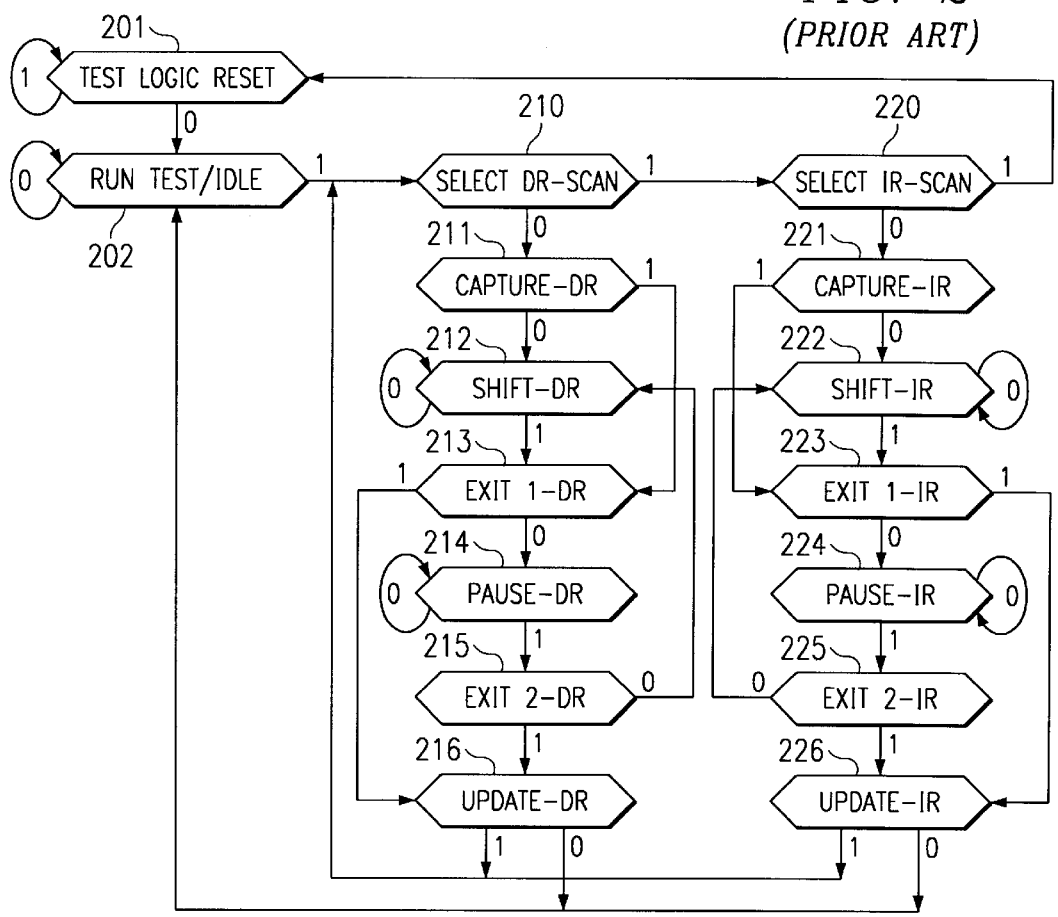
FIG. 2 illustrates the state diagram of the prior art JTAG test access port.

FIG. 2 illustrates a state diagram of test access port controller 121 as specified in the JTAG standard. All the signals illustrated are input at the test mode select pin 133 which are read at edges of the test clock. Test access port controller 121 is initially in test logic reset state 201. Test access controller 121 remains in Test Logic Reset state 201 while test mode select TMS is 1. If test mode select TMS becomes 0, then test access controller 121 transits to the Run Test/Idle state 202. Test access port controller 121 remains in the Run Test/Idle state while test mode select remains 0. If test mode select TMS becomes 1, then test access port controller 121 transits to Select Data Register-Scan state 210. Data from test data input TDI can be scanned into a selected data register in the Shift-Data Register state 211 or the process caused in Pause-Data Register state 214. From either Exit 1-Data Register state 213 or Exit 2-Data Register state 215, Update-Data Register state 216 updates the selected data register. If test mode select TMS is 0, then test access controller 121 returns to Run Test/Idle state 202. If test mode select TMS is 1, then test access controller 121 returns to Select Data Register-Scan state 210 to access another data register. According the JTAG standard the number of data registers and their length is implementation dependent. A similar loop including states 220 to 226 permits selection and scan into an instruction register. The JTAG standard specifies a single instruction register whose length is implementation dependent. The details of this state diagram are not important to this invention. It is sufficient to note that for any particular implementation of a test access port controller, it is possible to place the JTAG interface into a mode to shift in data from test data input pin 137 into any of the data registers and into the instruction register.

The JTAG standard was formulated with the goal of allowing exactly one test access port per IC. This standard does not take into account the possibility of designs containing multiple cores, some of which already have JTAG compliant test access ports. Consequently, the rapid rise in designs using multiple cores from a variety of vendors has made this shortcoming of JTAG, a major problem. Quite often, the JTAG compliant test access port in a core is inherited from its past as a standalone IC. This JTAG compliant test access port is intimately tied to testing and/or emulation strategies of the core. In many instances these cannot be easily changed. In many instances the semiconductor manufacturer has no access to the actual design which was purchased as a package from a core intellectual property vendor. Thus changes related to the test access port are impossible. Even if the manufacturer has access to the design, a new test access port design incurs extremely high expenses of reworking the tests and/or the emulation methodology. As a result, various ad-hoc solutions have emerged. There may be two or more such cores in a single integrated circuit. In addition, a typical integrated circuit having a core based design includes additional circuits not having an included test access port. The final integrated circuit design preferably includes a JTAG compliant test access port for testing these non-TAPed cores (NTC).

Figure 3:
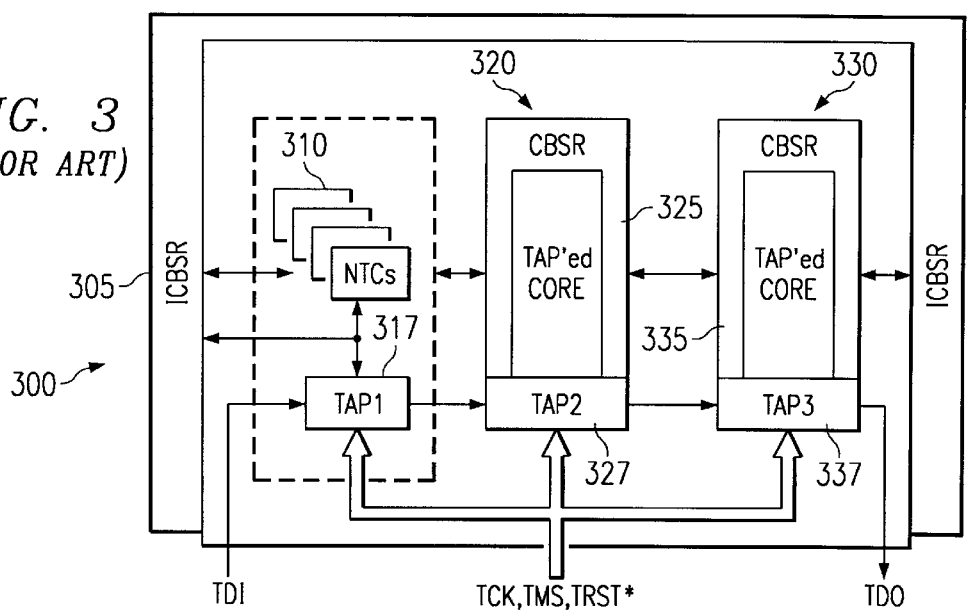
FIG. 3 illustrates a first prior art technique to include plural cores with JTAG compliant test access ports in a single integrated circuit in which the plural test access ports are serially connected.

FIG. 3 illustrates an example of a first known strategy dealing with this problem. In FIG. 3 the plural test access ports are serially connected. Integrated circuit 300 includes a boundary scan register (ICBSR) 305 similar to boundary scan register 127 illustrated in FIG. 1. Integrated circuit 300 includes plural non-TAPed cores referred to generally as 310 and TAPed cores 320 and 330. The non-TAPed cores 310 are connected to a first test access port TAP1 317. Test access port 317 is provided in the same manner as for original JTAG compliant designs. First TAPed core 320 includes its own core boundary scan register CBSR and a second test access port 327. Similarly, second TAPed core 330 includes core boundary scan register (CBSR) 335 and a third test access port TAP3 337. Each of the TAPed cores 320 and 330 forms a JTAG compliant system with its respective test access port TAP2 327 and TAP3 337. Both core boundary scan registers 325 and 335 are coupled to integrated circuit boundary scan register 305. A single scan chain from test data input TDI to test data output TDO is created for all test access ports in the entire integrated circuit 300. Though FIG. 3 illustrates three test access ports TAP1 317, TAP2 327 and TAP3 337, one skilled in the art would realize this technique could be used for integrated circuits with as few as two test access ports and for greater numbers of test access ports. The test data input TDI for integrated circuit 300 is coupled to the test data input of test access port 317. The test data output of test access port 317 is connected to the test data input of test access port 327. The test data output of test access port 327 is connected to the test data input of test access port 337. Finally, the test data output of test access port 337 forms the test data output TDO for integrated circuit. 300. The effectively chains up the test access ports in the embedded cores with the test access port providing test access to the entire integrated circuit 300. The other JTAG lines test clock TCK, test mode select TMS and test reset TRST* (if present) are connected to all the test access ports 317, 327 and 337 in parallel. This maintains the same integrated circuit pins as required of a single test access port.

The major problem with this approach is that the resultant design is essentially non-compliant with JTAG. Multiple test access port controllers get exercised in every clock cycle. Theoretically, one could compose test access port TAP1 317, test access port TAP2 327 and test access port TAP3 337 to create a composite TAP to force compliance with the JTAG framework. In reality, this is not an option. Core vendors are unlikely to provide all the information necessary to model the composite TAP. More importantly, the cost of creating such a model will be unacceptably high.

Figure 4:
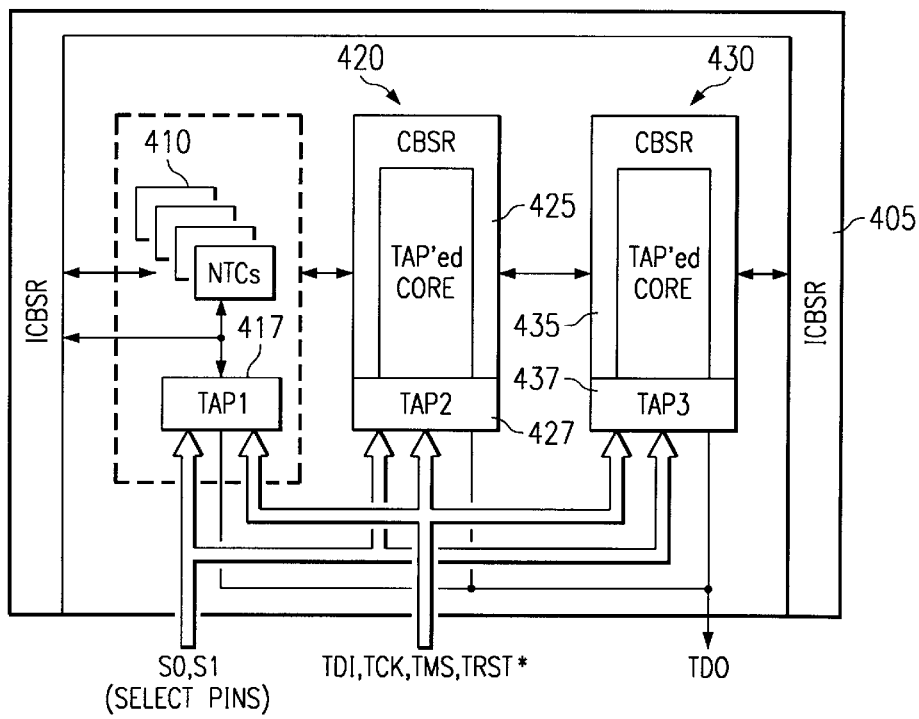
FIG. 4 illustrates a second prior art technique to include plural cores with JTAG compliant test access ports in a single integrated circuit in which the plural test access ports are selectively connected.

FIG. 4 illustrates a second known technique for combining plural cores with independent JTAG compliant test access ports on a single integrated circuit. In FIG. 4 the plural test access ports are individually selectable. Integrated circuit 400 includes a boundary scan register (ICBSR) 405, plural non-TAPed cores referred to generally as 410 serviced by test access port 417 and TAPed cores 420 and 430 in a manner similar to integrated circuit 300 illustrated in FIG. 3. In integrated circuit 400 all the pins specified in the JTAG standard, including test data in TDI, test data out TDO, test clock TCK, test mode select TMS and test reset TRST* (if present), are connected in parallel to all the test access ports 417, 427 and 437. This technique relies on the tri-state output requirement on the test data output TDO pins when the test access port is idle to be able to tie these together into one net. This technique uses extra select pins S0 and S1 to selectively enable individual test access ports 417, 427 and 437. This is needed in order to allow proper functioning of the test access ports when driven in parallel.

This second technique poses problems. The JTAG standard does not have any provision for the select pins S0 and S1. Consequently, extra logic needs to be added to each test access port to allow such selection via these selection pint. More importantly, the number of select pins increases with the number of embedded cores. This is likely to constitute an unacceptably high pin overhead, as the number of embedded cores in a single integrated circuit continues to increase. These select pins are also not recognized by the existing software tools for modeling and simulation of test access ports. Finally, the extra pins lead to extra routing in the system board. Overall, it is thus felt that the use of select pins to selectively enable TAPs, is not an acceptable solution.

Figure 5:
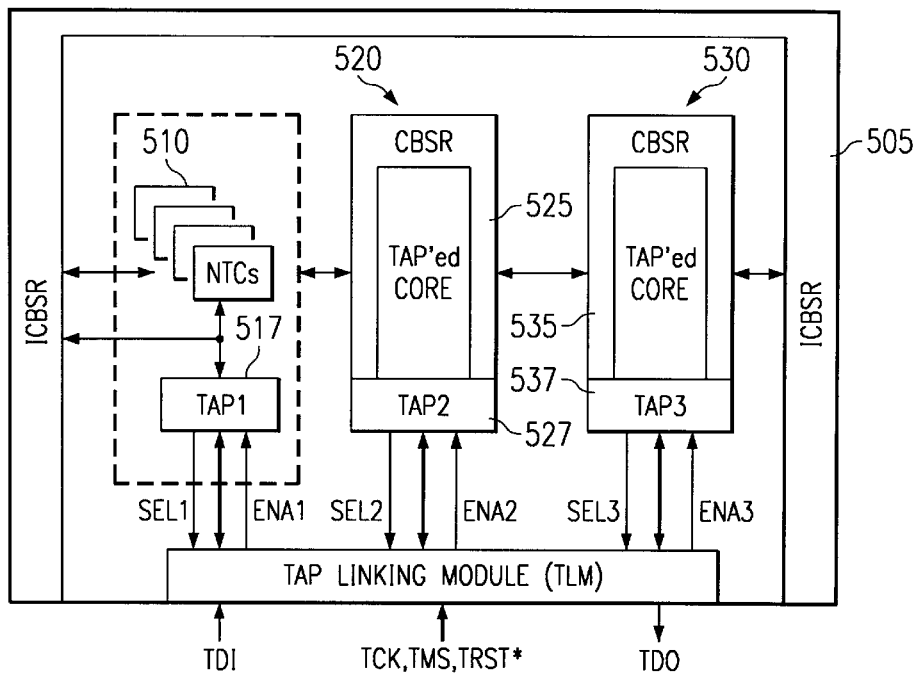
FIG. 5 illustrates a third prior art technique to include plural cores with JTAG compliant test access ports in a single integrated circuit known as test access port linking architecture.

FIG. 5 illustrates a third known technique for combining plural cores with independent JTAG compliant test access ports on a single integrated circuit. Integrated circuit 500 includes a boundary scan register (ICBSR) 505, plural non-TAPed cores referred to generally as 510 serviced by test access port 517 and TAPed cores 520 and 530 in a manner similar to integrated circuit 300 illustrated in FIG. 3 and integrated circuit 400 illustrated in FIG. 4. Lee Whetsel proposed this systematic solution to this problem, which is designated the test access port linking architecture (TLA), in Whetsel, L., "An IEEE 1149.1 Based Test Access Architecture for INTEGRATED CIRCUITS with Embedded Cores," *Proc. Int'l. Test Conference*, 1997. In this approach, the test bus according to the JTAG specified inputs and outputs is connected to a special module designated the test access port linking module TLM 540. The test access port linking module 540 is a finite-state machine which controls access to the test bus and selectively enables/disables the various test access ports 517, 527 and 537. The test access ports 517, 527 and 537 are connected to the integrated circuit JTAG inputs and outputs via test access port linking module 540. Test access port linking module 540 generates enable signals ENA1, ENA2 and ENA3 for corresponding test access ports TAP1 517, TAP2 527 and TAP3 537. Test access port TAP1 527 is selected at power-up or when test access port linking module 540 is reset. Test access port linking module 540 is a shared resource between the test access ports TAP1 517, TAP2 527 and TAP3 537. The state of test access port linking module 540 can be accessed and changed by the currently enabled test access port. This is achieved via the select signals SEL1, SEL2 and SEL3.

Figure 6:
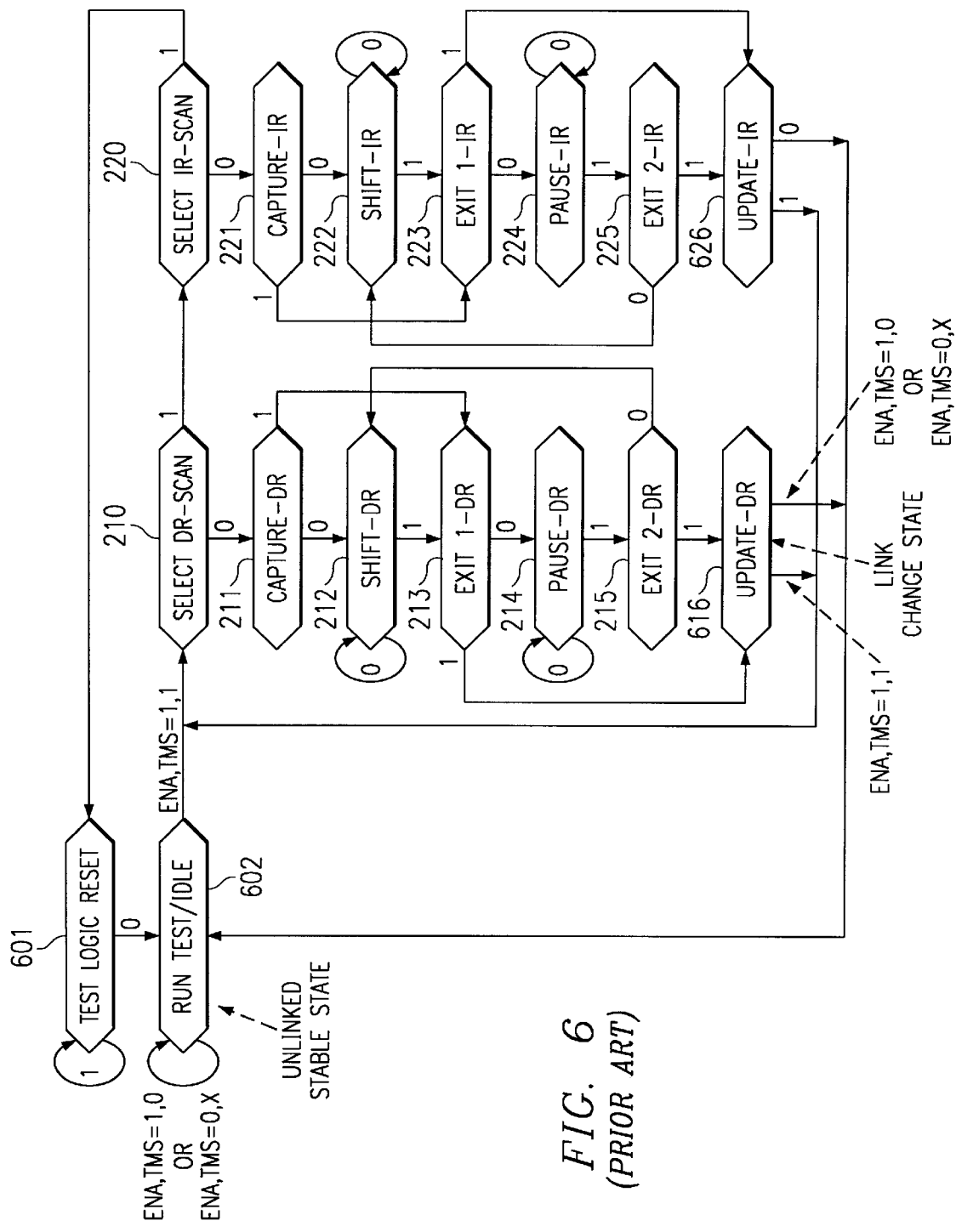
FIG. 6 illustrates the state diagram of the prior art test access port linking architecture.

FIG. 6 illustrates the state diagram of a system employing test access port linking module 540. In order to achieve proper selection and de-selection of the embedded cores using the test access port linking module 540, the state diagrams of the embedded test access port controllers must be modified. The test access ports leave Run Test/Idle state 602 only when both test mode select TMS and the corresponding enable ENA signal are 1. The update-Data Register state 616 links or unlinks depending upon the state of both the test mode select TMS signal and the corresponding enable ENA signal. Other portions of the test port controller state diagram are the same as the prior JTAG standard as illustrated in FIG. 2.

The test access port linking architecture (TLA) has several advantages over the other ad-hoc approaches illustrated in FIGS. 3 and 4. The test access port linking architecture forces synchronous transition of all test access ports and the test access port linking module from initial the reset state to the Run Test/Idle state. This technique allows the initially enabled test access port TAP1 to follow the test bus from Run Test/Idle state, while the non-enabled test access ports remain in the Run Test/Idle state. The test access port linking module allows all linking/unlinking operations to happen only in the Update-Data Register state. All unlinked test access ports automatically go to the Run Test/Idle state. This ability is especially useful for allowing cores with non-enabled test access ports to provide inputs to the core with the enabled test access port or allowing cores with non-enabled test access ports to run built-in self test (BIST) while the core with an enabled test access is exercised via the test bus. The test access port linking module also allows some flexibility in synchronizing the enabled test access ports state to the state of the test bus.

While the test access port linking architecture addresses several problems of other ad-hoc approaches to handling of embedded cores with built-in test access ports, many concerns remain. The fact that the existing test access ports in the embedded cores need to be modified to add extra ports and logic is a major concern. Extra hardware is needed to generate the SEL signal and extra logic is needed to properly handle the ENA signal. While the actual amount of hardware involved is small, such changes to the test access port involve significant non-recurring expense (NRE) in terms of validating the changes in the context of a given core. A more significant concern stems from the requirement that the embedded test access port controller state-diagrams be modified as illustrated in FIG. 6. This involves non-trivial effort re-design of the core and non-trivial changes to the software tools that model and simulate the test access environment. Given the amount of time needed to adopt accept the JTAG standard, any suggestion of a major re-design of existing parts is likely to meet with resistance from the vendors. Yet another concern arises out of the use of a separate test access port controller in the test access port linking module on top of test access port TAP1 used to provide JTAG compliant test access to the entire integrated circuit. The amount of logic involved is not large, but it is nevertheless overhead.

The most significant concern about the test access port linking architecture, stems from likely consequences of the rapid increase in the number of devices on an integrated circuit. The test access port linking architecture may not be able to provide the type of hierarchical test access solution that will be necessary. The following two examples illustrate possible shortcomings of the test access port linking architecture, in the context of future integrated circuit technologies. For systems where time to market is critical, and cost per piece is of secondary importance, it is widely expected that the board of today will become a single integrated circuit tomorrow, and an integrated circuit of today will become an embedded core tomorrow. When that happens, the test access port requirements for the core which includes the SEL and ENA ports will be different from the test pin requirements for today's integrated circuit which has no room for SEL and ENA pins in its JTAG compliant interface. Consequently, the test access port must be re-designed when the integrated circuit design becomes an embedded core. This would involve significant non-recurring expense. Even if today's integrated circuit were to be designed with a test access port linking module, when that integrated circuit design becomes an embedded core, the test access port linking module will have to be replaced by a test access port linking module that has SEL and ENA ports, since the integrated circuit design test access port linking module would have no room for the required SEL and ENA ports. Thus the test access port linking architecture does not provide a truly hierarchical solution to the test access problems for systems with multiple-levels of embedded cores, such as are foreseen in not-too-far future. With the advent of very short-channel integrated circuit technologies allowing billions of transistors to be integrated in one device, designers are likely to embed many tens of cores in one integrated circuit. Providing proper test access in such a design, will require the creation of a hierarchy of test access port linking modules. Two types of test access port linking modules will be required: the test access port linking module as proposed by Whetsel at the highest level of hierarchy; and a modified test access port linking module with SEL and ENA ports at lower levels of hierarchy.

Figure 7:
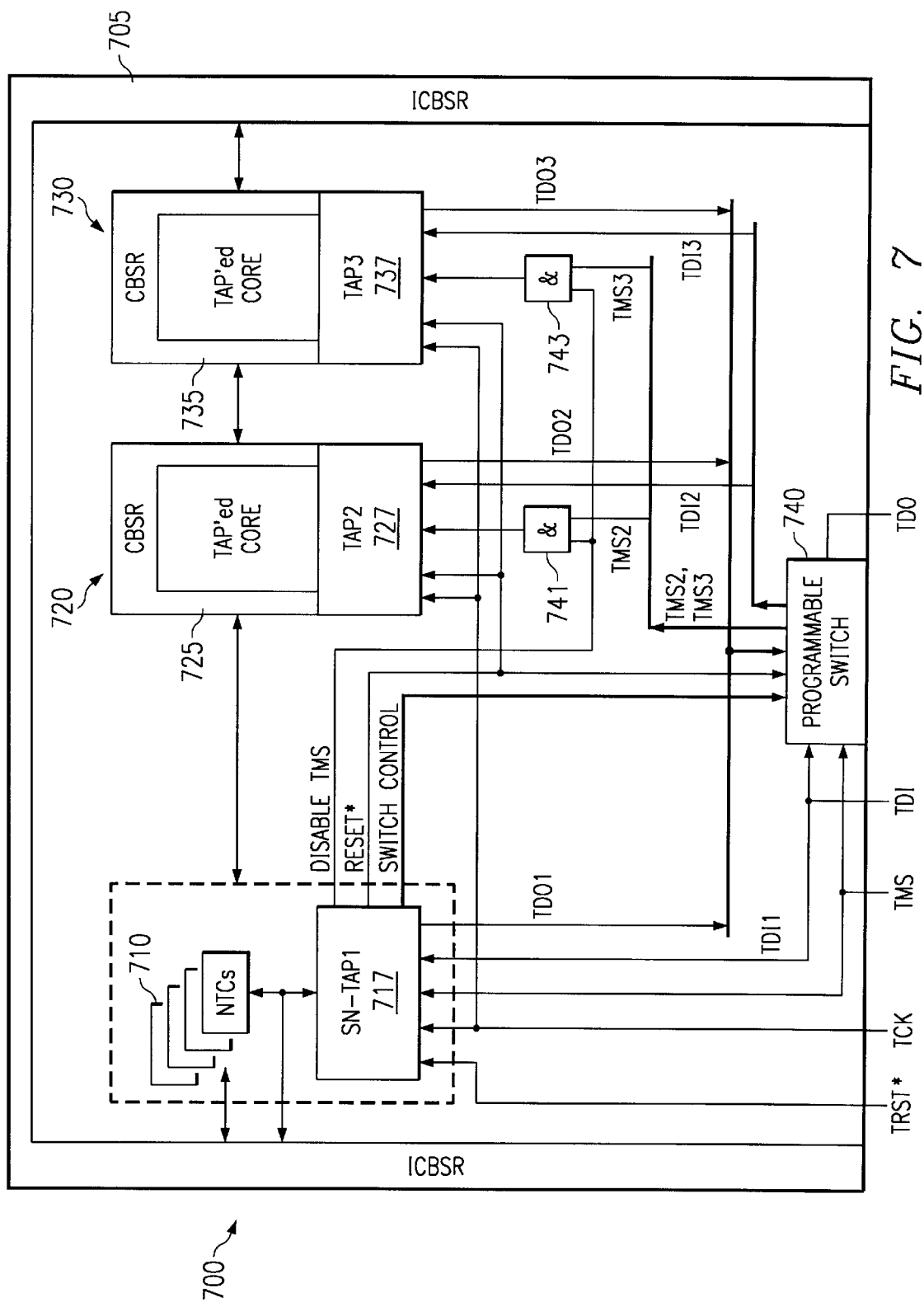
FIG. 7 illustrates the inventive technique for including plural cores with JTAG compliant test access ports in a single integrated circuit.

FIG. 7 illustrates the hierarchical test access port (HTAP) of this invention for combining plural cores with independent JTAG compliant test access ports on a single integrated circuit. Integrated circuit 700 includes a boundary scan register (ICBSR) 705, plural non-TAPed cores referred to generally as 710 serviced by test access port 717 and embedded TAPed cores 720 and 730 in a manner similar to integrated circuit 300 illustrated in FIG. 3, integrated circuit 400 illustrated in FIG. 4 and integrated circuit 500 illustrated in FIG. 5. From a functional point of view, the hierarchical test access port (HTAP) performs three major tasks in order to provide systematic and truly hierarchical test access to embedded cores. Firstly, the hierarchical test access port 727 preforms normal JTAG compliant test access port operations for the non-TAPed cores 710. Secondly, the hierarchical test access port 717 coordinates connection between the test bus and test access ports in embedded cores via a programmable switch 740. Lastly, hierarchical test access port 717 monitors the test access port currently being exercised via the test bus when an embedded test access port is in control of the test bus. This monitoring is accomplished via a snooping mechanism. The hierarchical test access port continues to monitor the test mode select line after yielding the test bus to an embedded test access port. The hierarchical test access port consists of two distinct blocks, a snoopy test access port (SN-TAP) 717 and a programmable switch 740. The programmable switch 740 is a crossbar switch with a flip-flop at each interconnection point. FIG. 7 illustrates an overall view of an example system employing a hierarchical test access port that includes two embedded cores and several pieces of non-core logic.

FIG. 7 illustrates the structural features of the hierarchical test access port of this invention. The test clock TCK pin of integrated circuit 700 is connected to the snoopy test access port 717 and to all embedded test access ports 727 and 737. This connection may optionally be made via a not illustrated buffer tree if necessary for drive considerations. The test mode select TMS and test data input TDI pins of integrated circuit 700 are connected directly to snoopy test access port 717 and to programmable switch 740. The test data output TDO output of snoopy test access port 717 is connected only to programmable switch 740. The embedded test access ports 727 and 737 receive their test mode select TMS and test data input TDI inputs from programmable switch 740. The embedded test access ports 727 and 737 supply their test data outputs TDO only to programmable switch 740. The test data output TDO of integrated circuit 700 is supplied by programmable switch 740. The optional test reset TRST* pin of integrated circuit 700 is supplied to snoopy test access controller 717 and may be passed on to programmable switch 740.

Figure 8:
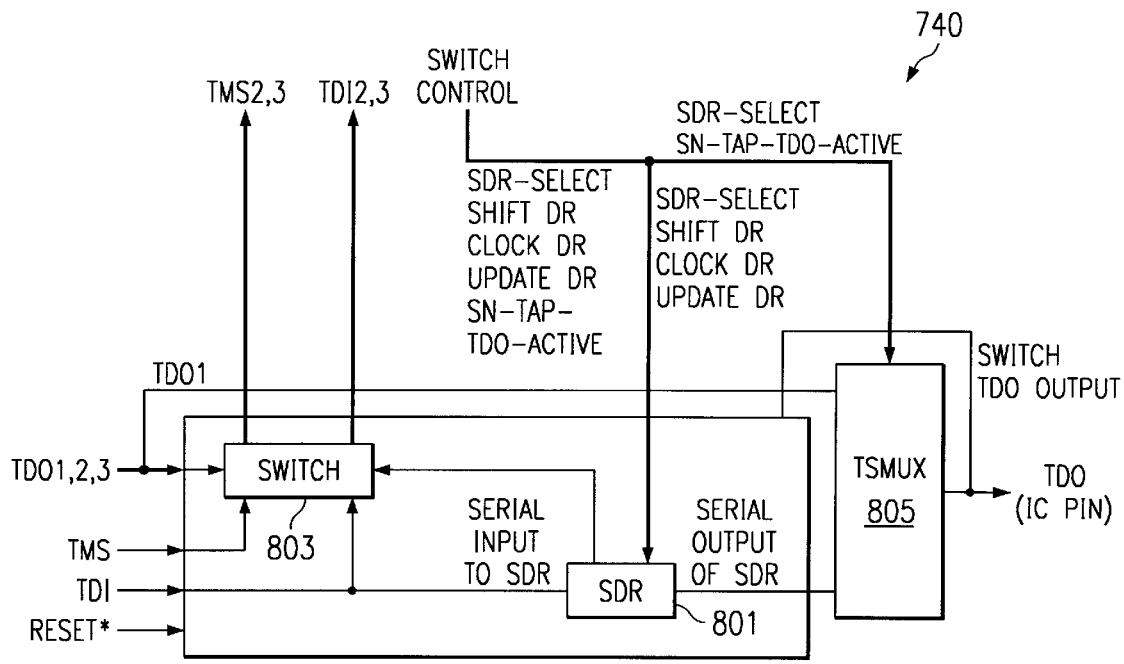
FIG. 8 illustrates the features of the programmable switch of this invention illustrated in FIG. 7.

FIG. 8 illustrates details of programmable switch 740. Control of the state of programmable switch 740 is provided by switch data register SDR 801. Switch data register SDR 801 is a data register controllable by snoopy test access port 717. Switch 803 is essentially a crossbar switch between test mode select TMS, test data input TDI and test data outputs TDO1, TDO2 and TDO3 as inputs and test mode select TMS2 and TMS3 and test data inputs TDI2 and TDI3 as outputs. Each crosspoint controlled by a flip-flop (or latch, if appropriate). These flip-flops together constitute switch data register 801. Switch data register 801 is controlled by snoopy test access port 717 and hence can be set to any combination of values shifted in via the integrated circuit TDI pin. This permits virtually any interconnection between the embedded test access ports. Some of the possible interconnection modes may not be JTAG compliant. Such non-compliant interconnection modes may be used for vendor-specific testing of integrated circuit 700.

Switch data register SDR 801 is controlled via a set of signals generated by snoopy test access port 717 known collectively as switch control. These signals are an implementation dependent control permitted by the JTAG standard. As seen in FIG. 8, the test data output TDO of snoopy test access port 717 and the serial output of switch data register 801 require somewhat special handling. This will is discussed below.

Figure 9:
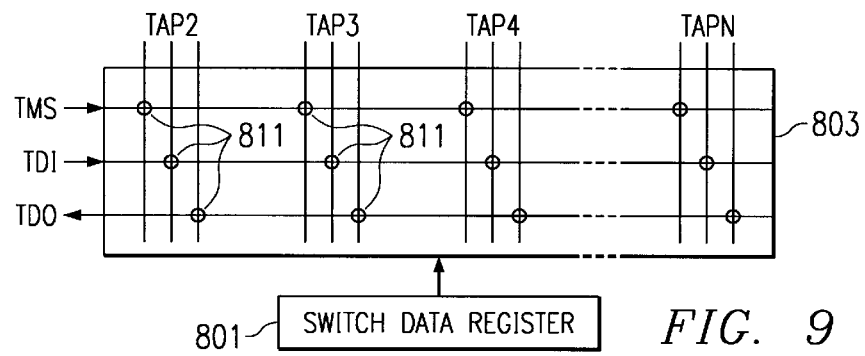
FIG. 9 illustrates one manner in which the switch data register controls the state of the programmable switch.
Figure 10:
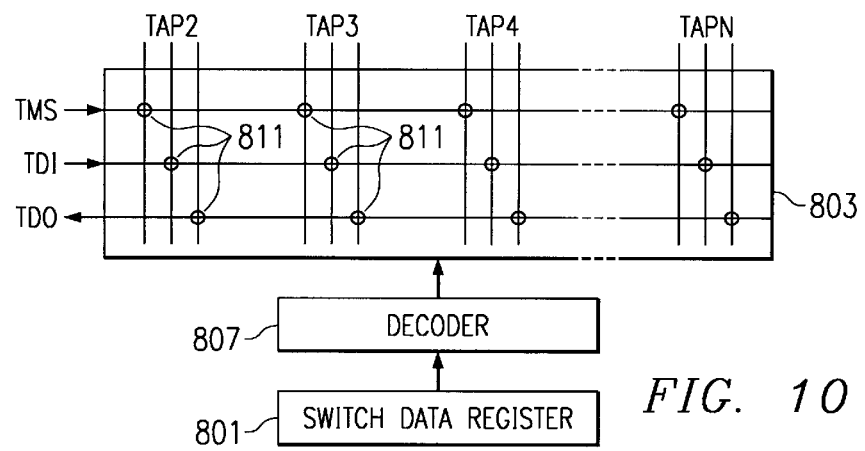
FIG. 10 illustrates an alternative manner in which the switch data register controls the state of the programmable switch.

FIGS. 9 and 10 illustrate alternative manners in which switch data register 801 controls switch 803. Switch 803 is a crossbar with horizontal lines connected to integrated circuit 700 test mode select TMS, test data input TDI and test data output TDO pins. The vertical lines are connected to the JTAG connections of the various embedded cores. Crosspoint connections 811 optionally connect corresponding horizontal and vertical lines. For example, switch 803 could have crosspoints 811 enabled to connect the integrated circuit 700 test mode select TMS, test data input TDI and test data output TDO pins to only test access port TAP2 727. FIG. 7 illustrates test access port TAP2 727 and test access port TAP3 737. Those skilled in the art would realize that any number of test access ports could be connected in the fashion illustrated in FIGS. 9 and 10.

In FIG. 9, each crosspoint 811 corresponds to a bit within switch data register 801. The state of each bit in switch data register 801 controls the open or closed status of the corresponding crosspoint 811. This technique required a minimum amount of logic overhead while allowing the maximum flexibility of connection. This technique allows individual control of each crosspoint 8111 via the corresponding bit of switch data register 801.

In FIG. 10, the state of switch data register 801 is decoded to produce the control signals for crosspoints 811. The individual bits of switch data register 801 are supplied to decoder 807. Decoder 807 receives the state of all bits within switch data register 801 and then forms signals for control of the crosspoints 811. By permitting only some of the possible combinations of crosspoint states, the circuit of FIG. 10 enables switch data register 801 to be embodied in fewer bits. This permits loading any of the allowed states in less time than required according to the circuit of FIG. 9.

The particular technique selected is a design choice. This design choice is made based upon whether a greater number of register bits and greater connectivity is favored over fewer register bits and the area required for the decoder circuit. Note that other types of interconnections including those which are not JTAG-compliant are possible. In particular, it is possible to add horizontal lines for the test data output TDO signal of each embedded core enabling the serial scan paths of the embedded cores to be chained. For the purpose of this invention it is sufficient that switch 803 can selectively connect integrated circuit 700 test mode select TMS, test data input TDI and test data output TDO pins to one of the embedded cores.

Figure 11:
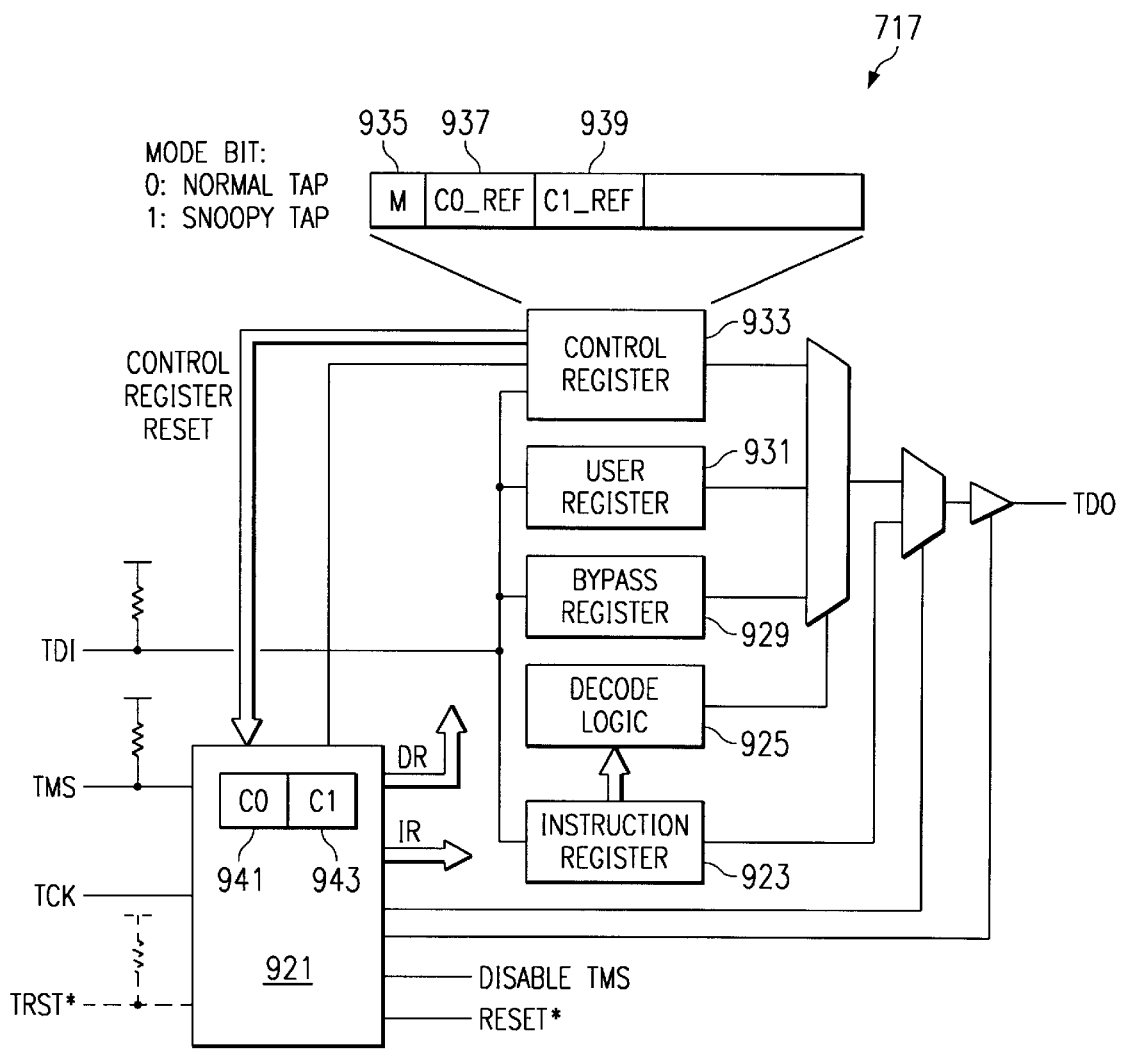
FIG. 11 illustrates the features of the snoopy test access port of this invention illustrated in FIG. 7.

FIG. 11 illustrates the construction of snoopy test access port 717 according to this invention. Snoopy access port 717 is very similar to prior art test access port 100 illustrated in FIG. 1. Snoopy test access port 717 includes as part of its permitted data registers control register 933. Control register 933 is illustrated schematically as including mode bit M 935, C0 reference count 937 (C0_REF) and C1 reference count 939 (C1_REF). Snoopy test access port controller 921 is in normal test access port mode if mode bit M 935 is 0. If mode bit 933 is 1, then snoopy test access port controller 921 can be in a snoopy state. This will be more fully described below. Snoopy test access port controller 921 includes C0 counter 941 and C1 counter 943, whose use will be described below.

Figure 12:
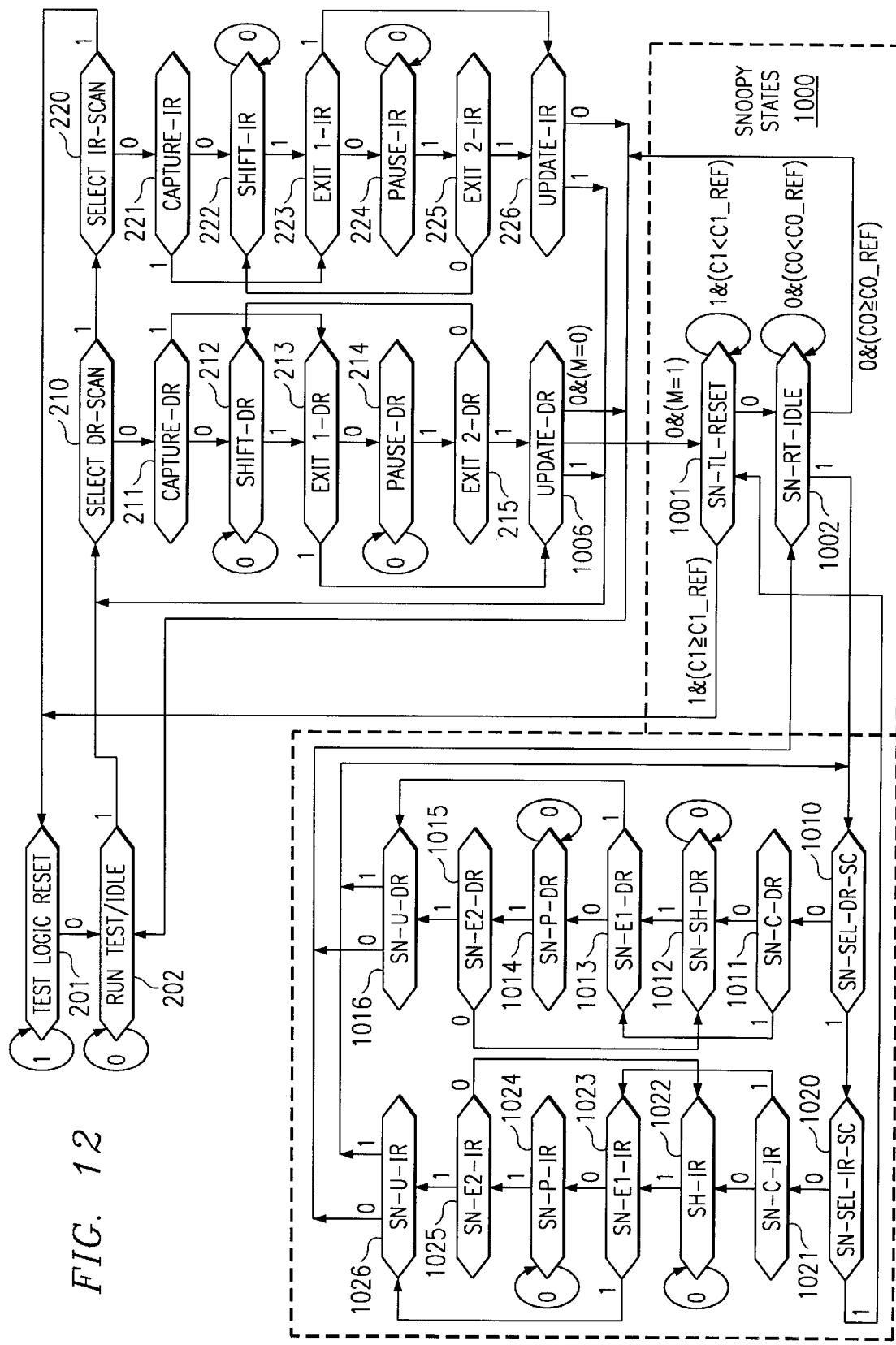
FIG. 12 illustrates the state diagram of the snoopy test access port of this invention.

FIG. 12 illustrates the state diagram of the snoopy test access port controller 921 of FIG. 11. Many of the states are the same as those illustrated in FIG. 2. Test access port controller 921 transits from Update-Data Register state 1006 to a set of snoopy states 1000 if test mode select TMS is 1 and the mode bit M 935 of control register 933 is also 1. Note if mode bit M 935 is 0, then snoopy test access controller 921 transitions to Run Test/Idle state 202 as in FIG. 2. With mode bit M 935 equal to 1, snoopy test access controller 921 is in the snoopy mode and operates in a set of snoopy states 1000. Snoopy test access controller 921 supplies a switch control signal to programmable switch 740 to enable the switch. Thus the connections set by switch data register 801 are effective. As an example, suppose switch data register 801 has been set to connect test access port TAP2 727 of embedded core 720 to the external test access port signals test mode select TMS, test data input TDI and test data output TDO. Due to this connection of programmable switch 740, the integrated circuit 700 test mode select TMS and test data input TDI signals are now supplied to embedded core 720 and the test data output TDO signal of embedded core 720 are supplied to the integrated circuit 700 test data output TDO output. In the snoopy states 1000, snoopy test access port 717 snoops on the test mode select TMS input via its direct connection. These snoopy states 1000 follow and shadow the corresponding JTAG states of the enabled embedded core 720. Note that states 1001, 1002, 1010 to 1016 and 1020 to 1026 correspond to respective JTAG states 201, 202, 210 to 216 and 220 to 226 illustrated in FIG. 2. Note that embedded core 720 can thus be tested according to the original JTAG compliant test vectors without modification. Note that during this process snoopy test access controller 921 mostly monitors the state of the connected embedded core JTAG test.

There are two snoopy states which are different from their counterparts in the normal test access controller. The Snoopy Test Logic Reset state 1001 (SN-TL-Reset) differs from the counterpart Test Logic Reset state 201 and the snoopy Run Test/Idle state 1002 (SN-RT-Idle) differs form the counterpart Run Test/Idle state 202. These two states provide the handshaking capability to enable return of control to snoopy test access port 717. This is achieved by counting the number of consecutive 0's on the test mode select TMS input using counter C0 914 or by counting the number of 1's on the test mode select TMS input using counter C1. These counts are compared to the counts in respective C0 reference count 937 and C1 reference count 939 provided in control register 933. The roles of the counters in controlling the behavior of snoopy test access port controller 717 are explained below.

The C1 counter 943 counts the number of consecutive 1's on the test mode select TMS input, when snoopy test access controller 921 is in Snoopy Test Logic Reset state 1001. If the count in C1 counter 943 remains less than C1_REF, the value set in C1 reference count 939, then snoopy test access port controller 921 continues to operate in the snoopy states 1000. If the count in C1 counter 943 equals or exceeds C1_REF, the value of C1 reference count 939, or C1 counter 943 counts to its maximum value C0_max, then snoopy test access port controller 921 leaves the snoopy state. Snoopy test access port controller 921 resets itself by transiting to the Test Logic Reset state 201. When snoopy test access controller 921 resets, it resets the mode bit M 935 in control register 933. This prevents return to the snoopy state, until the mode bit M 935 is explicitly set. If a 0 is received while in Snoopy Test Logic Reset state 1001, then snoopy test access controller 921 transits to the Snoopy Run Test/Idle state 1002. Note that while C1 counter 943 is counting consecutive 1's, the test access port controller of the enabled embedded core remains in Test Logic/Idle state. Also note the count of C1 counter 943 is reset upon each initial entry into Snoopy Test Logic Reset state 1001. The count C1_REF needs to be greater than the longest expected normal sequence of test mode select TMS 1's for any of the embedded cores.

The C0 counter 941 counts the number of consecutive 0's on the test mode select TMS input, when snoopy test access controller 921 is in Snoopy Run Test/Idle state 1002. If the count in C0 counter 941 remains less than the value set in C0 reference count 937, then snoopy test access controller 921 continues to operate in the snoopy states 1000. If the count in C0 counter 941 equals or exceeds the value in C0 reference 937, or C0 counter 941 counts to its maximum value, then snoopy test access controller 921 leaves the Snoopy Run Test/Idle state 1002 and transitions the Run Test/Idle state 202. In this case mode bit M 935 remains at 1. The count of C0 counter 941 is reset upon each initial entry into Snoopy Run Test/Idle state 1002. The count C0_REF needs to be greater than the longest expected normal sequence of test mode select TMS 0's for any of the embedded cores.

An appropriate sequence of inputs on test mode select TMS can be used to put snoopy test access port controller 921 quickly back into the snoopy states 1000. This capability is extremely useful in many scenarios. As a first example, this capability can be used when transferring control of the test bus from one embedded core test access port to another. In this case snoopy test access port controller 921 can go back to normal mode briefly, to reprogram programmable switch 740, and then return quickly to the snoopy states 1000 transferring control to the next embedded core test access port. As a second example, this capability can be used when exercising built-in self test (BIST) sequentially on multiple embedded cores. Snoopy test access port controller 921 can go back to normal mode for setup necessary in-between BIST runs and then return to the snoopy states 1000. These sequences do not require having to explicitly set the mode bit M 935 every time.

Figure 13:
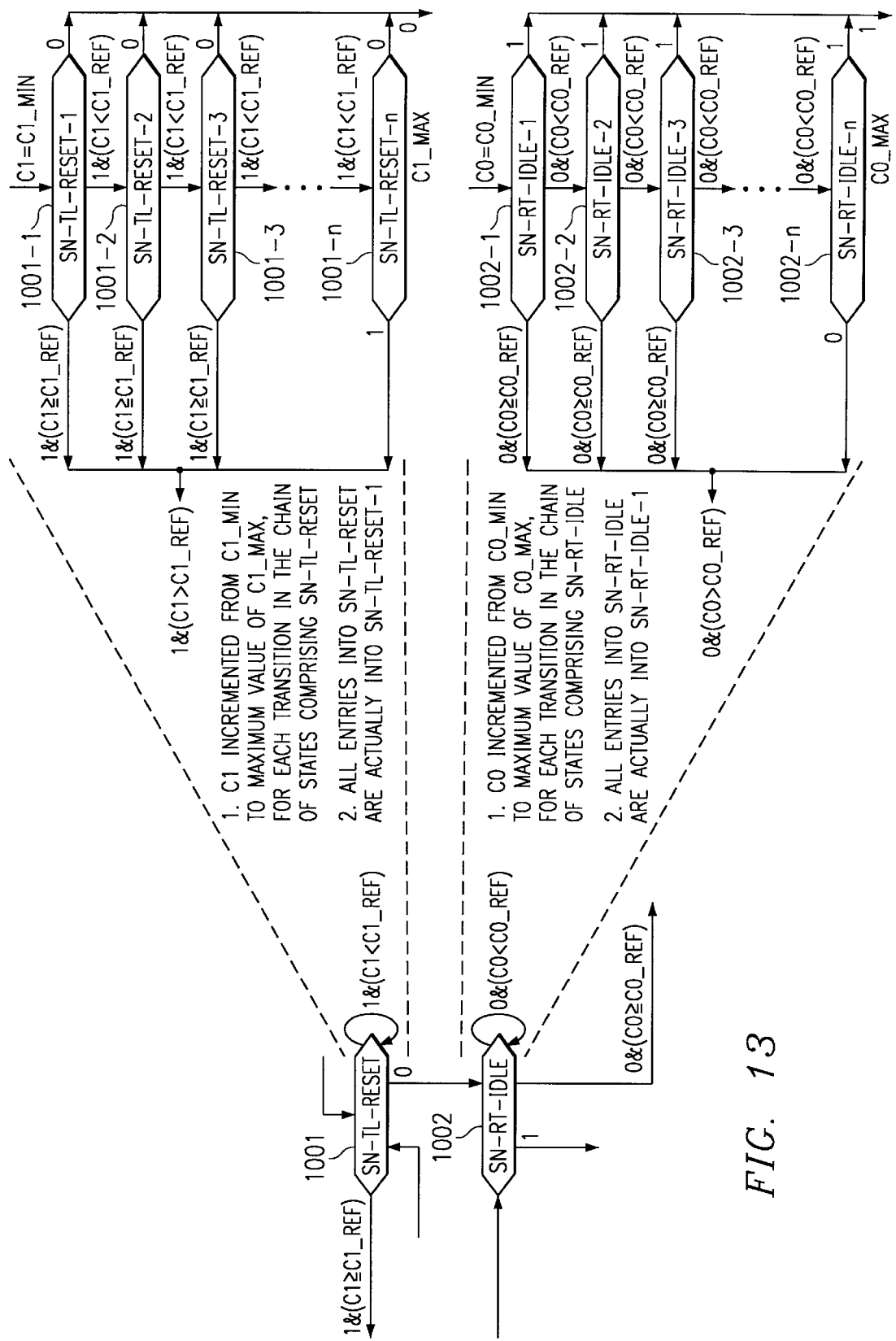
FIG. 13 illustrates an expanded view of two of the states of the snoopy test access port illustrated in FIG. 11.

FIG. 13 illustrates an exploded view of the various actions taken in the Snoopy Test Logic Reset state 1001 and the Snoopy Run Test/Idle state 1002. For the sake of brevity, FIG. 12 illustrated two self-loops for the Snoopy Test Logic Reset state 1001 and the Snoopy Run Test/Idle state 1002. FIG. 13 explicitly shows the counting actions performed in these states and the exit conditions that apply. For Snoopy Test Logic Reset state 1001 there are a series of states 1001-1 to 1001-n, where n is the maximum count of C1 counter 943. Each entry into Snoopy Test Logic Reset state 1001-1 resets the C1 count to C1_min, which will generally be 0. If test mode select is 0, then snoopy test access port controller 921 moves from any of these states to Snoopy Run Test/Idle state 1002-1. If test mode select TMS is 1 and C1 is less than both C1 reference count and C1_max, then snoopy test access port controller 921 advances to the next of the series of states. If test mode select TMS is 1 and C1 is greater than C1_REF or the current state is Snoopy Test Logic Reset State 1001-n indicating a count to C1-max, then snoopy test access port controller 921 transits to Test Logic Reset state 201. For Snoopy Run Test/Idle state 1002 there are a series of states 1002-1 to 1002-n, where n is the maximum count of C0 counter 941. Each entry into Snoopy Run Test/Idle state 1002-1 resets the C0 count to C0_min, which will generally be 0. If test mode select TMS is 1, then snoopy test access port controller 921 moves from any of these states to Snoopy Select-Data Register Scan state 1010. If test mode select TMS is 0 and C0 is less than both C0 reference count and C0_max, then snoopy test access port controller 921 advances to the next of the series of states. If test mode select TMS is 0 and C0 is greater than C0_REF or the current state is Snoopy Run Test/Idle State 1002-n indicating a count to C0-max, then snoopy test access port controller 921 transits to Run Test/Idle state 202. Thus each of these states should be replaced by the corresponding chain of states with different C0 or C1 values, as shown explicitly in FIG. 13.

Snoopy test access port controller 921 also generates two output signals not part of the JTAG standard illustrated in FIG. 1. These signals provide additional control over the operation of the embedded test access ports to which snoopy test access port controller 921 may hand over control of the test bus. The first signal is the Disable TMS signal. This is supplied to AND gates 741 and 743 (FIG. 7) to control supply of test data input TDI to the corresponding embedded cores. This disable TMS signal is low-active when snoopy test access controller 921 has control of the test bus. Thus embedded cores do not receive the test mode select TMS signal when snoopy test access port controller 921 has control of the test bus. This Disable TMS signal is high-inactive when snoopy test access controller 921 is in a snoopy state. This permits the supply of the test mode select signal to the embedded cores. In order to avoid spuriously activating embedded test: access ports, the default output of the programmable switch 740 on lines connected to TMS input of embedded test access ports should be 0. The second signal is Reset*. Reset* is active whenever snoopy test access port controller 921 is in Test Logic Reset state 201. The Reset* signal is supplied to programmable switch 740 as illustrated in FIGS. 7 and 8 to reset programmable switch 740 when snoopy test access port controller 921 is reset. The Reset* signal is connected to the TRST* input of the embedded test access ports if they have this input. In other words, all embedded test access port controlled by snoopy test access port controller 921 are reset whenever snoopy test access port controller 921 is reset.

Snoopy test access port controller 921 generates a set of control signals for programmable switch 740 designated Switch Control in FIGS. 7 and 8. Switch Control includes data register control signals according to the JTAG standard, These are Shift Data Register, Clock Data Register and Update Data Register. Switch Control further includes an Switch Data Register Select signal to ensure JTAG compliant access to the flip-flops in programmable switch 740. The Switch Data Register Select signal is asserted when the Switch Data Register is selected by snoopy test access port controller 921. Switch Data Register Select also connects the serial output of the Switch Data Register to the test data output TDO pin of integrated circuit 700 via appropriate control of the TSMUX 805 provided a Snoopy Test Access Port Test Data Output-Active signal has also been asserted. The Snoopy Test Access Port Test Data Output-Active signal is asserted wherever snoopy test access port controller 921 is in a non-snoopy scan state, that is Shift Data Register state 212 or Shift Instruction Register state 222. Conceptually, the Snoopy Test Access Port Test Data Output-Active signal is the Boolean OR of Shift Data Register and Shift Instruction Register. When Snoopy Test Access Port Test Data Output-Active is asserted without asserting Switch Data Register-Select, then the test data output TDO of snoopy test access port controller 921 is connected to integrated circuit 700 test data output TDO via TSMUX 804 illustrated in FIG. 11. If Snoopy Test Access Port Test Data Output-Active is not asserted, the all connections from snoopy test data output TDO and the Switch Data Register 801 serial output to the integrated circuit 700 test data output TDO pin are cut. This is achieved by holding the output of TSMUX 805 in a high-impedance state. Table 1 summarizes the behavior of TSMUX 805 for various states of Switch Data Register-Select and Snoopy Test Access Port Test Data Output-Active.

TABLE 1

| SDR-Select | SN-TAP-TDO-Active | TSMUX Output |
| --- | --- | --- |
| X | 0 | Hi-Z |
| 0 | 1 | TDO output of Snoopy Test Access Port Controller |
| 1 | 1 | Serial output of Switch Data Register |

This behavior of TSMUX 805 eliminates any possible contention on the tri-state line connected to the test data output TDO pin of the IC. The embedded core test access ports are assumed to tri-state their test data output TDO outputs when they are in Test Logic Reset state 201 and when they are in Run Test/Idle state 202 as clearly required by the JTAG standard.

The following discussion of hierarchical test access port behavior uses the system shown in FIG. 7. Operation of any system employing a hierarchical test access port at the highest level of test access hierarchy, starts with resetting the snoopy test access port 717. This is assumed to reset all embedded test access ports, i.e. test access ports 727 and 737. Snoopy test access port 717 then moves to Run Test/Idle state 202 and asserts Disable TMS. All embedded test access port controllers will also move to Run Test/Idle state 202. Thereafter only snoopy test access port 717 responds to changes on the test bus. All the embedded test access ports remain in Run Test/Idle state 202.

The following sequence of steps will be typical when snoopy test access port 717 yields control of the test bus to an embedded test access port.

(1) Snoopy test access port 717 shifts an instruction into instruction register 923 via appropriate cycles beginning at Select-Instruction Register-Scan state 220 to select control register 933.

(2) Snoopy test access port 717 sets mode bit M 935 in control register 933 to 1, and sets C0_REF field 937 and C1_REF field 939 in control register 933 to desired values. This takes place via a sequence of data register scan cycles beginning in the Select-Data Register-Scan state 210.

(3) Snoopy test access port 717 exits the Update-Data Register state 1006 at the end of Data Register-Scan sequence mentioned above. With test mode select TMS signal held at 1, snoopy test access port 717 returns immediately to Select-Data Register-Scan state 210.

(4) The test mode select TMS signal will be held at 1 for one more cycle, taking snoopy test access port 717 to Select-Instruction Register-Scan state 220.

(5) Snoopy test access port 717 is cycled to shift a new instruction to select the Switch Data Register 801 in the programmable switch 740 into instruction register 923.

(6) Snoopy test access port 717 exits Update-Instruction Register state 226 with test mode select TMS held at 1, to immediately go to Select-Data Register-Scan state 210.

(7) Snoopy test access port 717 sets the desired configuration of switches in Switch Data Register 801 via shift operations via the Select-Data Register-Scan state 212. The configuration setting will not connect any embedded test access port to the test bus until snoopy test access port 717 exits Update-Data Register state 226 according to the JTAG standard. For this example assume that test access port TAP2 727 gets connected to the test bus.

(8) Snoopy test access port 717 exits Update-Data Register state 1006 with test mode select TMS held at 0. This coupled with the setting of mode bit M to 1 in step 2, will take snoopy test access port 717 into the starting snoopy state the Snoopy Test Logic Reset state 1001.

At the end of step 8, snoopy test access port 717 will be in Snoopy Test Logic Reset state 1001. Test access port TAP2 727, just connected to the test bus, will likely be in Run Test/Idle state 202. To ensure synchronization between the test bus, snoopy test access port 717, and test access port TAP2 727, test mode select TMS should be held at 0 for one more cycle. Snoopy test access port 717 will go to the Snoopy Run Test/Idle state 1002 and test access port TAP2 727 remains in Run Test/Idle state 202. Beyond this point, there will be a one to one correspondence between the snoopy state transitions of snoopy test access port 717, and the normal state transitions in test access port TAP2 727, until test access port TAP2 727 enters either Run Test/Idle state 202 or Test Logic Reset state 201. Snoopy test access port 717 will be in snoopy states only and will take no action whatsoever, as a consequence of these state transitions.

If test access port TAP2 727 enters Run Test/Idle state 202 at the end of its test sequence, then snoopy test access port 717 enters Snoopy Run Test/Idle state 1002. Snoopy test access port 717 can be awakened and taken out of the snoopy states 1000 from this state by holding the test mode select TMS input at 0 for an appropriate duration of time. For example, if C0_REF is set to 5, then holding test mode select TMS at 0 for five test clock TCK cycles will cause snoopy test access port 717 to transition to Run Test/Idle state 202. Note that test access port TAP1 727 will continue to be in Run Test/Idle state 202. Thus synchronization between the test bus, snoopy test access port 717, test access port TAP2 727 and test access port TAP3 737 will be established. All these test access ports will return to Run Test/Idle state 202 as it existed before Step 1.

If test access port TAP2 727 entered Test Logic Reset state 201 at the end of its test sequence, then snoopy test access port 717 will enter Snoopy Test Logic Reset state 1002. Snoopy test access port 717 can be awakened and taken out of the snoopy states 1000 by holding the test mode select TMS at 1 for an appropriate duration of time. For example, assuming C1_REF is set to 5, holding test mode select TMS at 1 for five test clock TCK cycles will cause snoopy test access port 717 to transition to Test Logic Reset state 201. Test access port TAP2 727 will remain in Test Logic Reset state 201 as test mode select TMS is held at 1. Thus snoopy test access port 717 and test access port TAP2 727 will be synchronized. Following this transition to non-snoopy states when test mode select TMS goes to 0, both snoopy test access port 717 and test access port TAP2 727 will enter Run Test/Idle state 202. This synchronizes again Snoopy test access port 717 and all embedded test access ports.

Basic operation of the hierarchical test access port are as follows. The test sequence is assumed to begin with tests for the non-TAPed logic with snoopy test access port 717 operating as a normal test access port. This is followed by the first transfer of control to test access port TAP2 727 in embedded core 720. Snoopy test access port 717 is awakened from the Snoopy Run Test/Idle state 1002 using a string of 0's on test mode select TMS. The number of such 0's is determined by the value of C0_REF 937 when control register 933 is programmed. Control of the test bus is then transferred to test access port TAP3 737 in embedded core 730. Snoopy test access port 717 again enters the snoopy states 1000. Note that mode bit M 935 can remains set to 1 throughout the transfer of control of test bus from test access port TAP2 720 to test access port TAP3 730. Reprogramming programmable switch 740 involves shifting data into only one register, switch data register 801. Note that switch data register 810 was the last register selected before control was handed over to embedded core 720. Thus no new data register needs to be selected for transferring control of the test bus to embedded core 730. Neither instruction register 923 nor mode bit M 935 needs to be changed.

In other situations, where multiple instruction register-scan or data register-scan operations might be necessary to set other registers, snoopy test access controller 92L can be instructed to perform these operations by holding test mode select TMS at 1 whenever it leaves either Update-Data Register state 1006 or Update-Instruction Register state 226 without having to reset mode bit M 935 to 0 first. At the end of either an instruction register-scan or a data register-scan, snoopy test access port controller 921 can be put back into the snoopy states 1000 by holding test mode select TMS at 0 when in Update-Data Register state 1002, since mode bit M has remained set at 1.

Finally, synchronization of an embedded test access port, the test bus, and snoopy test access port 717 can be assured even assuming the embedded test access port starts out in an unknown state. This can be achieved in to the absence of a TRST* input to the embedded core. This is achieved by continuing test mode select TMS as 1. A study of the JTAG states illustrated in FIG. 2 shows that each embedded test access port will eventually reach the Test Logic Reset state 201. Likewise, snoopy test access port controller 921 will eventually reach Snoopy Test Logic Reset state 1001, and after a number of consecutive cycles with test mode select TMS set to 1, transit to Test Logic Reset state 201. It will generally be desirable to have a TRST* input for all embedded test access ports. Otherwise an embedded test access port could power up in active states like Shift-Data Register state 212 or Shift-Instruction Register state 222, which might cause problems.

Figure 14:
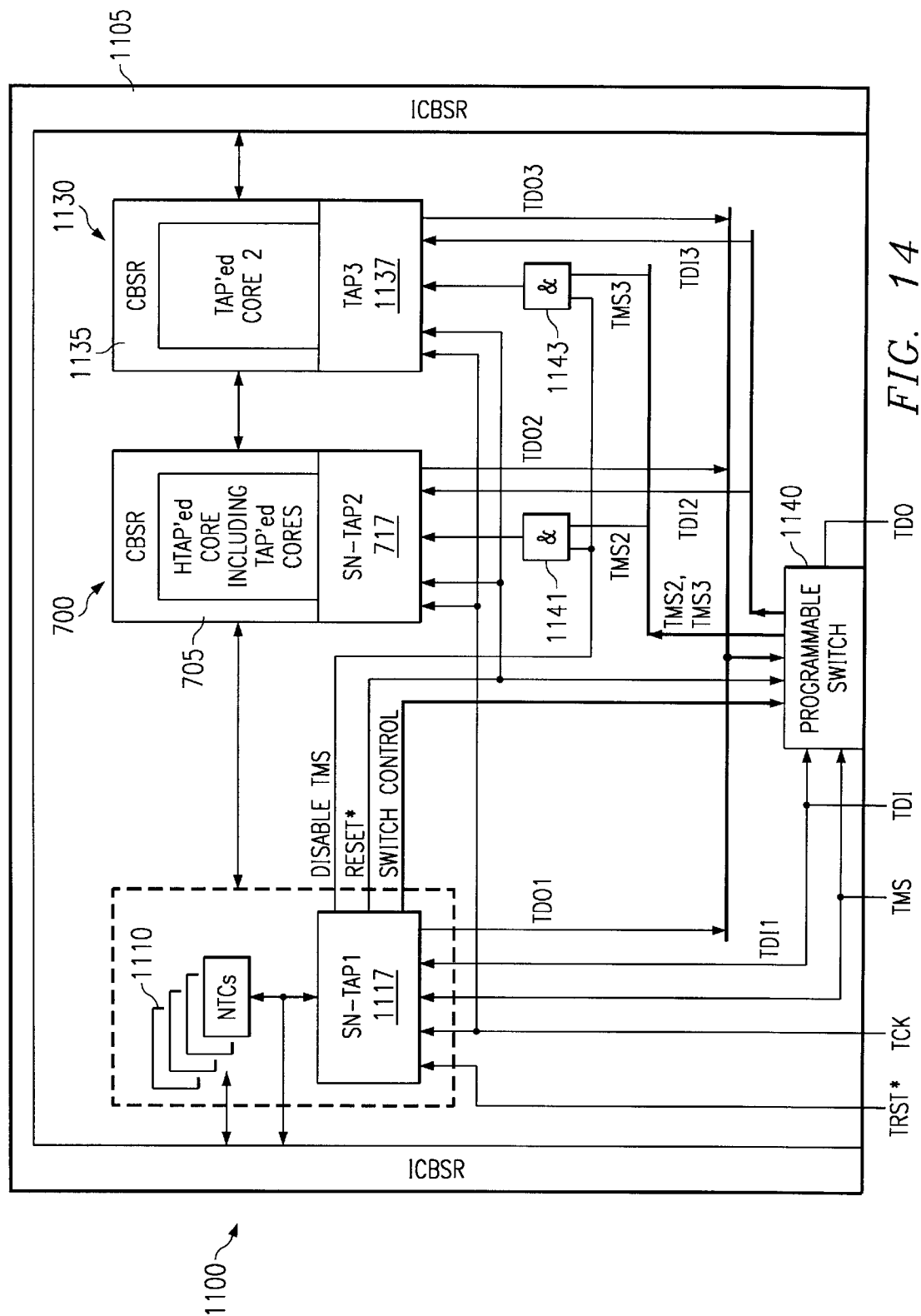
FIG. 14 illustrates a use of the hierarchical test access port of this invention.

FIG. 14 illustrates a further aspect of the hierarchical test access port of this invention. Integrated circuit 700 illustrated in FIG. 7 has now become embedded core 700 in integrated circuit 1100. Integrated circuit 1100 includes a boundary scan register (ICBSR) 1105, plural non-TAPed cores referred to generally as 1110 serviced by test access port 1117 and embedded TAPed cores 700 and 730. Hierarchical test access port 1127 performs normal JTAG compliant test access port operations for the non-TAPed cores 1110 and coordinates connection between the test bus and test access ports in embedded cores 700 and 1130 via a programmable switch 1140. Integrated circuit 1100 is connected in the same fashion as integrated circuit 700 illustrated in FIG. 7. Hierarchical test access port 1117 performs snoopy monitoring in the manner described above. Note that snoopy test access port TAP2 717, which is fully JTAG compliant, can be tested via the test port in the same manner as other embedded cores. Thus the shrinking of an integrated circuit to an embedded core will have no adverse effect on the testability of the core.

Figure 15:
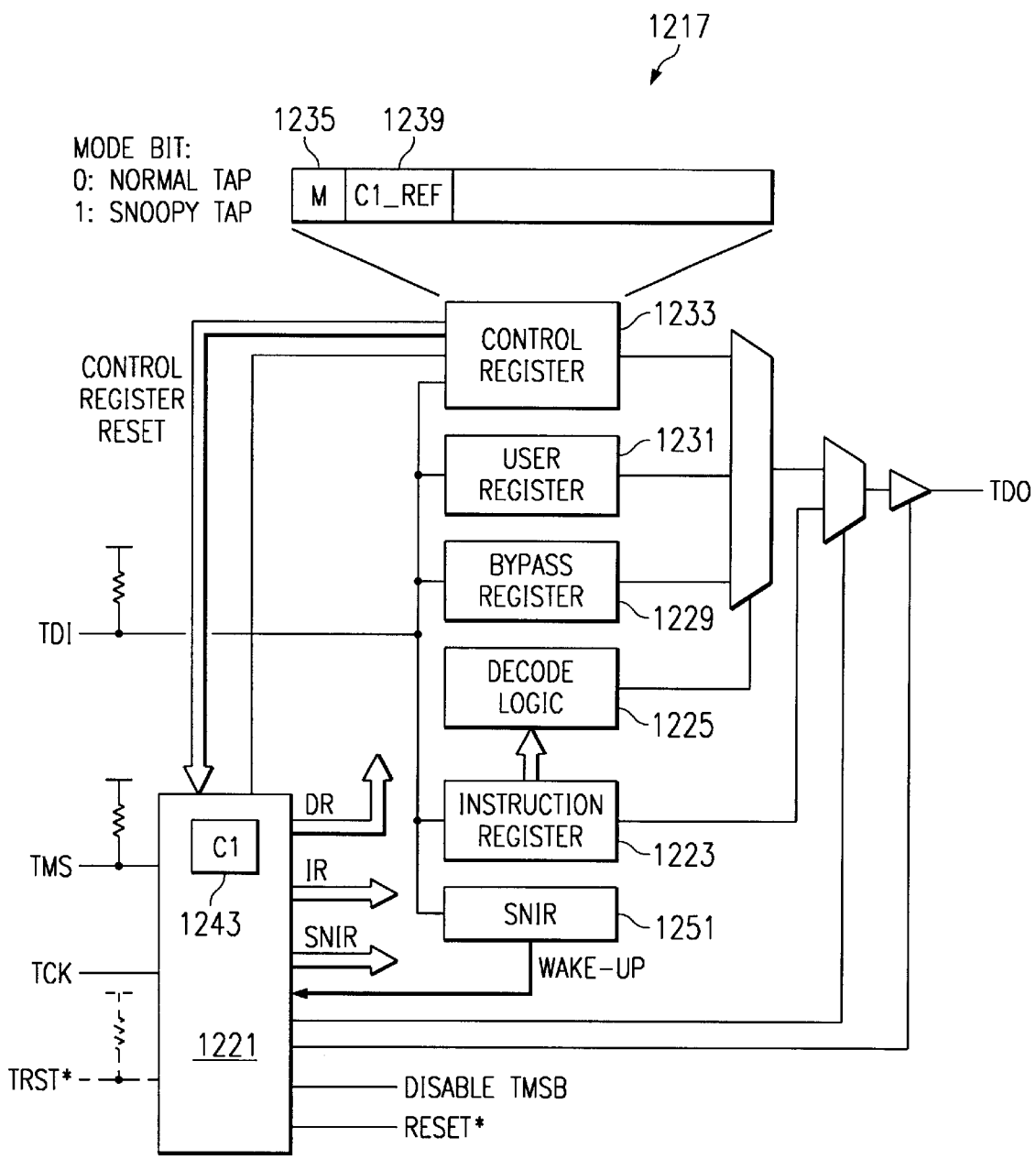
FIG. 15 illustrates the construction of snoopy test access port employing an alternative manner of returning from snoopy state.
Figure 16:
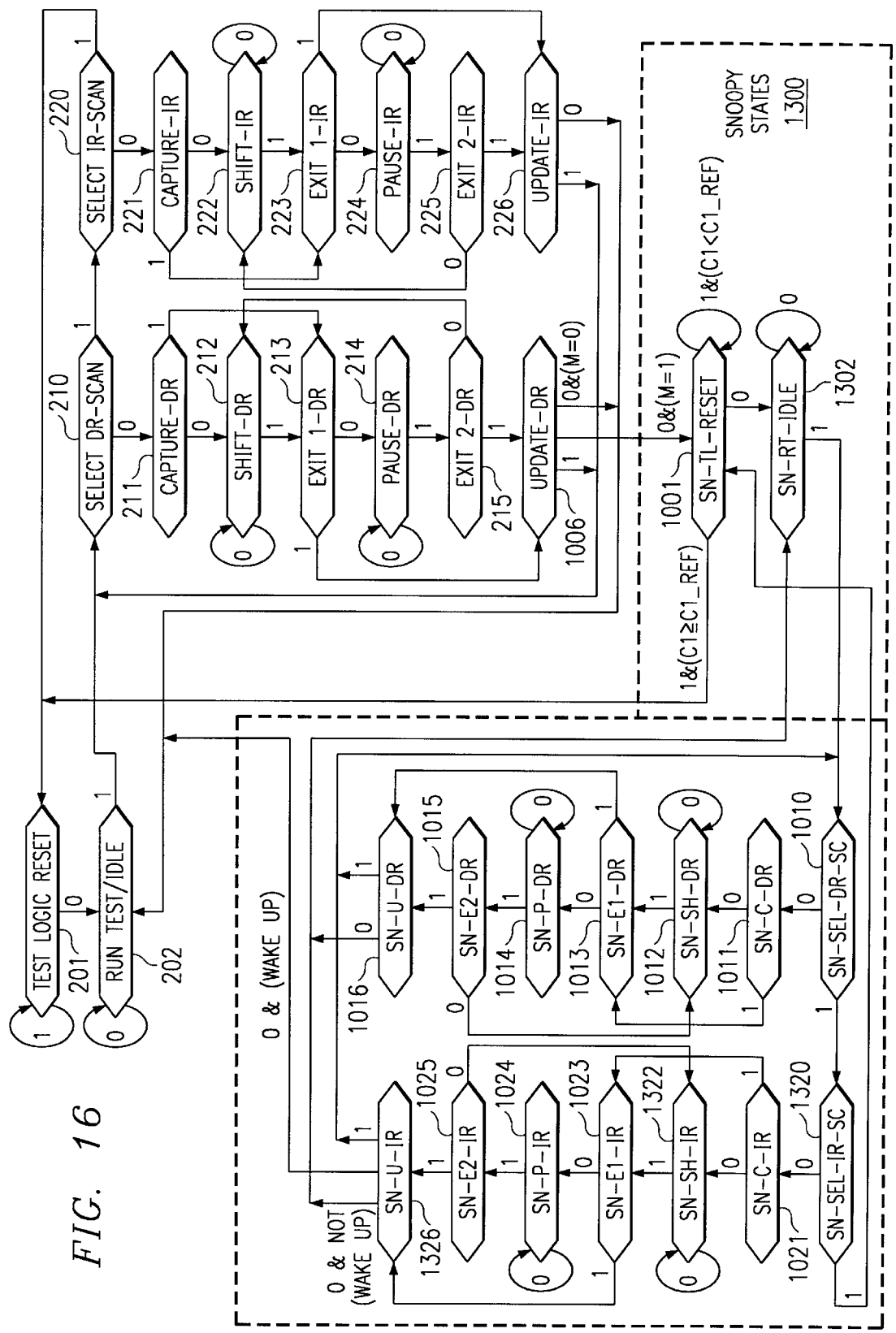
FIG. 16 illustrates a state diagram of the alternative of FIG. 15.
Figure 17:
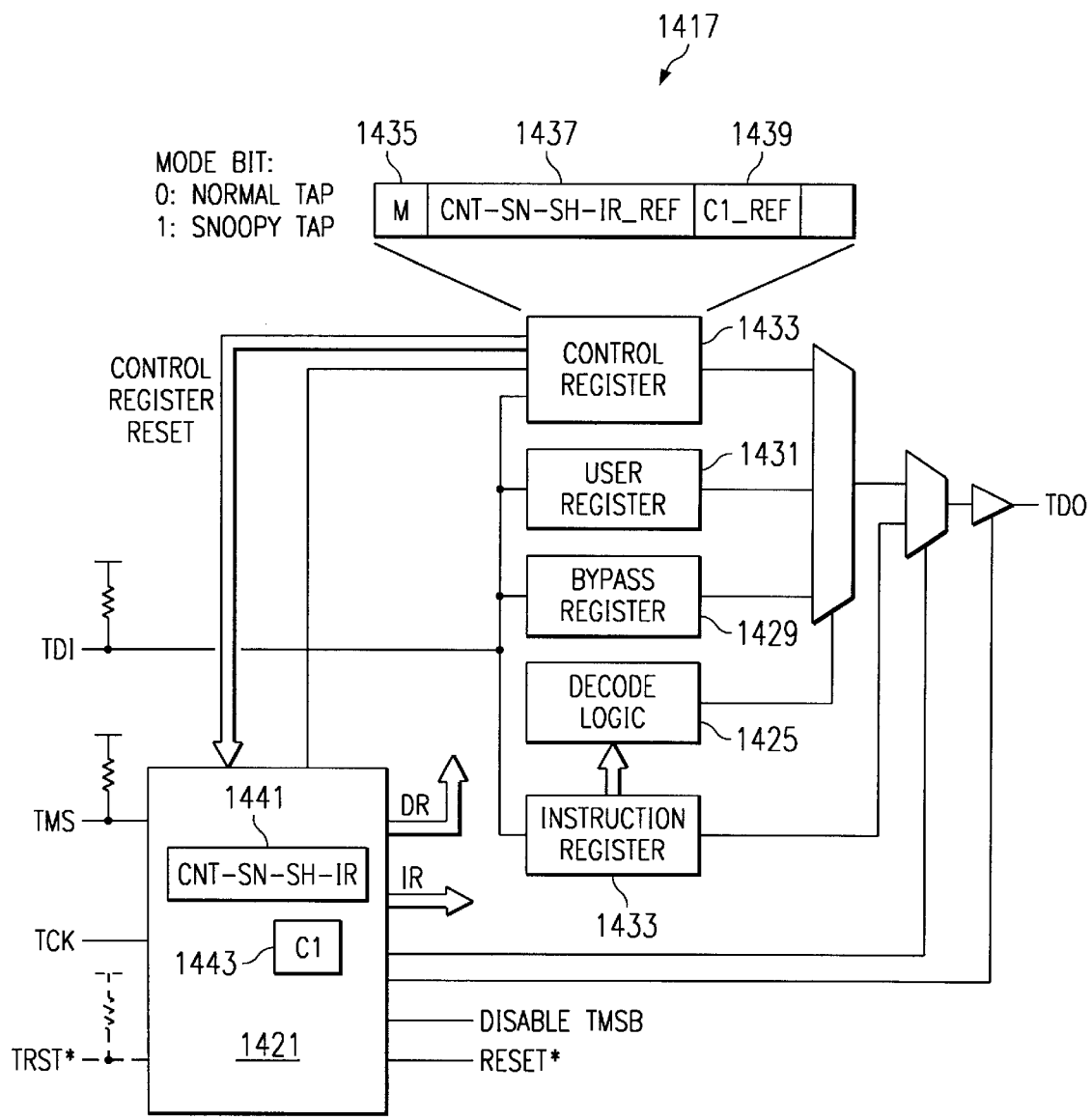
FIG. 17 illustrates the construction of snoopy test access port employing a second alternative manner of returning from snoopy state.
Figure 18:
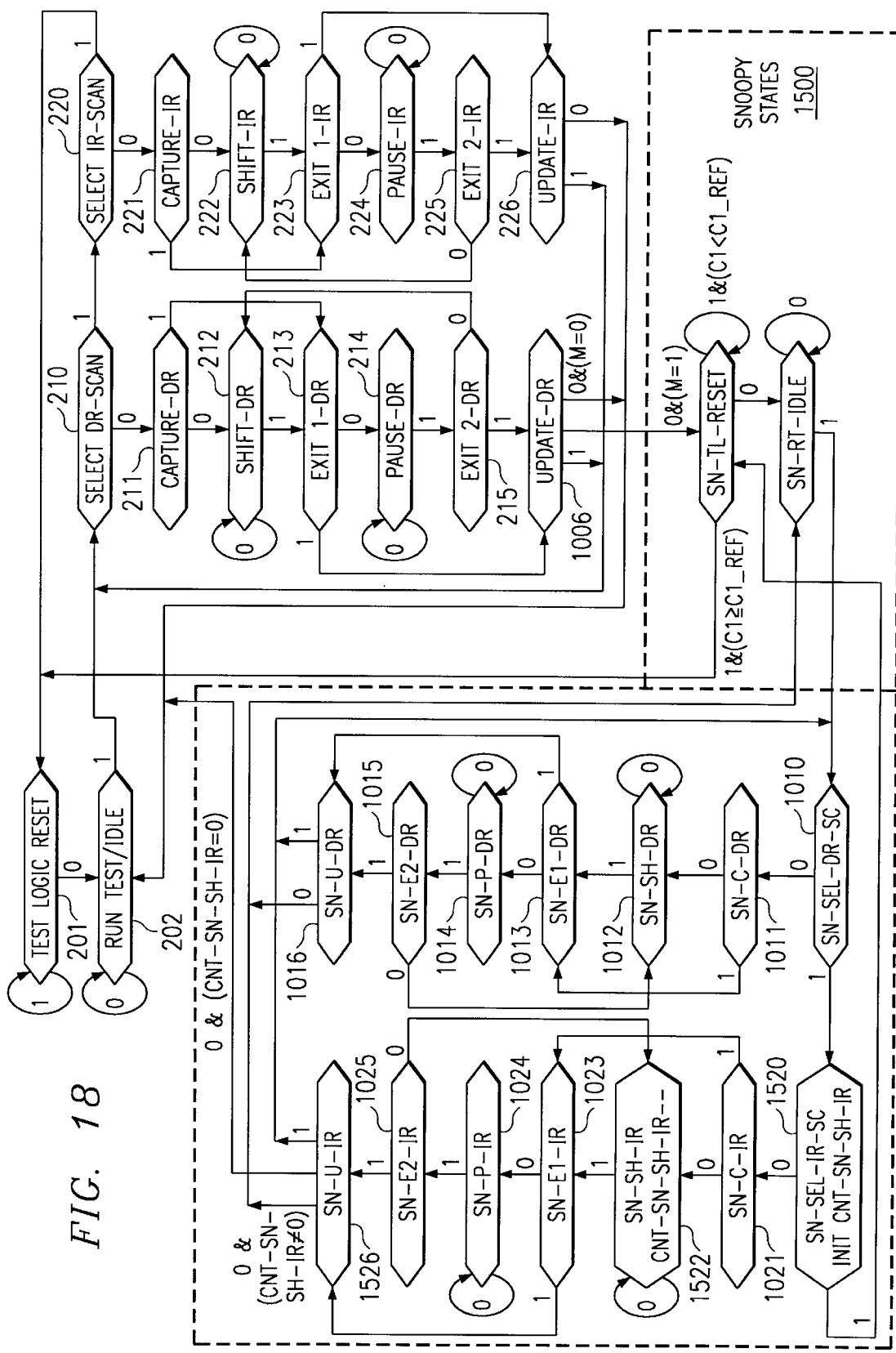
FIG. 18 illustrates a state diagram of the second alternative of FIG. 17.

FIGS. 15 to 18 illustrate alternate techniques for returning snoopy test access port controller 717 to non-snoopy states. FIGS. 15 and 16 illustrate a first alternative technique using a snoopy instruction register. FIGS. 17 and 18 illustrate a second alternative technique using a snoopy shift instruction register counter. Each of these alternative techniques are responsive to instructions shifted into the enabled embedded core while snoopy test access port controller 921 is in snoopy states.

FIG. 15 illustrates the construction of snoopy test access port 1217 according to an alternative of this invention. Snoopy access port 1217 may be substituted for snoopy test access port 717 illustrated in FIG. 11. Snoopy test access port 1217 includes control register 1233. Control register 1233 is illustrated schematically as including mode bit M 1235 and C1 reference count 1239 (C1_REF). Snoopy test access port controller 1221 is in normal test access port mode if mode bit M 1235 is 0 and can be in the snoopy state 1300 if mode bit M 1233 is 1. Snoopy test access port controller 1221 includes C1 counter 1243. Lastly, snoopy test access port 1217 includes snoopy instruction register 1251. Snoopy instruction register 1251 is used in snoopy states to change snoopy test access port controller 1221 back to normal mode. Snoopy instruction register 1251 is an implementation extension of the JTAG standard. This structure is not contemplated in the JTAG standard.

FIG. 16 illustrates the state diagram of the snoopy test access port controller 1221 of FIG. 15. Many of the states are the same as the that illustrated in FIG. 12. These identical state have the same reference numbers. Test access port controller 1221 transits from Update-Data Register state 1006 to the snoopy states 1300 if test mode select TMS is 1 and the mode bit M 1235 of control register 1233 is also 1. With mode bit M 1235 equal to 1, snoopy test access controller 1221 is in the snoopy states 1300. In the snoopy states 1300 snoopy test access port 1217 snoops on the test mode select TMS input via its direct connection. The Snoopy Test Logic Reset state 1001 operates in the same manner as described above. The C1 counter 1243 counts the number of consecutive 1's on the test mode select TMS input, when snoopy test access controller 1221 is in Snoopy Test Logic Reset state 1001. If the count in C1 counter 1243 remains less than C1_REF, the value set in C1 reference count 1239, then snoopy test access port controller 1221 continues to operate in the snoopy states 1000. If the count in C1 counter 1243 equals or exceeds C1_REF, the value of C1 reference count 1239, or C1 counter 1243 counts to its maximum value C1_MAX, then snoopy test access port controller 1221 leaves the snoopy state and resets itself by transiting to the Test Logic Reset state 201. Note that this functionality is achieved via the expanded states 1001-1 to 1001-n described above in conjunction with FIG. 13.

FIG. 16 illustrates another technique enabling snoopy test access port controller 1221 to exit the snoopy states 1300 and return to normal mode of operation. In the Snoopy Shift Instruction Register state 1322, snoopy instruction register 1251 shifts in and stores the test data input TDI in the same manner as the instruction register of the enabled embedded core. When in the Snoopy Update Instruction Register state 1326, snoopy test access port controller 1221 advances to the Snoopy Run Test/Idle state 1302 if test mode select TMS is 1. Note that Snoopy Run Test/Idle state 1302 differs from Snoopy Run Test/Idle state 1002 described in conjunction with FIG. 12. Snoopy Run Test/Idle state 1302 does not count consecutive 0's in test mode select TMS and cannot enable return from snoopy states 1300. When in Snoopy Update Instruction Register state 1326, if test mode select TMS is 0, then snoopy test access port controller 1221 takes differing action depending on whether the just updated instruction is a wake-up instruction for snoopy test access port controller 1221. If the just updated instruction is not the wake-up instruction, then snoopy test access port controller 1221 transits to Snoopy Run Test/Idle state 1302. Thus snoopy test access port controller 1221 continues to shadow the state of the enabled embedded core. If the just updated instruction is a wake-up instruction, then snoopy test access port controller 1221 wakes up from the snoopy states. 1300 and transits to Run Test/Idle state 202.

A special selection of this wake-up instruction can enable it not to interfere with normal instructions used in the embedded cores. It is preferable to select the wake-up instruction as having more bits than the maximum length instruction used by any of the embedded cores. When using the wake-up instruction only the snoopy instruction register 1251 will hold all the bits of the instruction. The instruction register of the enabled embedded core will hold only the last received instruction bits. It is known in the JTAG art to use an instruction of all 1's as a bypass instruction. The preferable wake-up instruction is similar except it has at least one more bit. Thus snoopy instruction register 1251 can be initialized in the opposite state from the embedded core bypass instruction. This initialization preferably occurs upon entry of Snoopy Select Instruction Register Scan state 1320. Observation of a change of state at the most significant bit of snoopy instruction register 1251 indicates receipt of the wake-up instruction. Note that use of the bypass instruction on the currently enabled embedded core is merely an example. An instruction can be used so long as the instruction is longer than the longest instruction shift in sequence of any embedded core.

FIG. 17 illustrates the construction of snoopy test access port 1417 according to another alternative of this invention. Snoopy access port 1417 may be substituted for snoopy test access port 717 illustrated in FIG. 11. Snoopy test access port 1417 includes control register 1433. Control register 1433 is illustrated schematically as including mode bit M 1435, snoopy shift instruction register reference count 1437 (Cnt-Sn-Sh-IR_REF) and C1 reference count 1439 (C1_REF). Snoopy test access port controller 1421 is in normal test access port mode if mode bit M 1435 is 0 and can be in snoopy state if mode bit M 1433 is 1. Snoopy test access port controller 1421 includes Cnt-Sn-Sh-IR_REF counter 1441 and C1 counter 1243. The snoopy shift instruction register counter 1441 is used in snoopy states to change snoopy test access port controller 1421 back to normal mode.

FIG. 18 illustrates the state diagram of the snoopy test access port controller 1421 of FIG. 17. Many of the states are the same as the that illustrated in FIG. 12. These identical state have the same reference numbers. Test access port controller 1421 transits from Update-Data Register state 1006 to the snoopy states 1500 if test mode select TMS is 1 and the mode bit M 1435 of control register 1433 is also 1. With mode bit M 1435 equal to 1, snoopy test access controller 1421 is in the snoopy states 1500. In the snoopy states 1500 snoopy test access port 1417 snoops on the test mode select TMS input via its direct connection. The Snoopy Test Logic Reset state 1001 operates in the same manner as described above.

FIG. 18 illustrates another alternative technique enabling snoopy test access port controller 1421 to exit the snoopy states 1500 and return to normal mode of operation. When entering Snoopy Select Instruction Register Scan state 1520, snoopy shift instruction register counter 1441 is initialized. In the preferred embodiment snoopy shift instruction register counter 1441 is a count down counter initialized with the contents of snoopy shift instruction register reference count 1437. This is a mere design choice to count down from the reference count to 0. It is possible to count up from 0 to the reference count. In the Snoopy Shift Instruction Register state 1522, snoopy shift instruction register counter 1441 counts number of test clock cycles in this state. When in the Snoopy Update Instruction Register state 1526, snoopy test access port controller 1421 advances to the Snoopy Run Test/Idle state 1302 if test mode select TMS is 1. When in Snoopy Update Instruction Register state 1526, if test mode select TMS is 0 and snoopy shift instruction register counter 1441 has not counted down to 0, then snoopy test access port controller 1421 transits to the Snoopy Rut Test/Idle state 1302. On the other hand, if test mode select TMS is 0 and snoopy shift instruction register counter 1441 has counted down to 0, then snoopy test access port controller 1421 transits Run Test/Idle state 202. The maximum count of snoopy shift instruction register counter 1441 should be greater than the maximum instruction shift sequence length for any of the embedded cores. This technique has an advantage over the technique of FIGS. 15 and 16. First, the counter is likely to require fewer bits and less area than the snoopy instruction register. Second, no particular wake-up instruction is needed, any instruction shift equal in length to the reference count will trigger wake-up.

There are many advantages of using the hierarchical test access port of this invention to provide test access to embedded cores. This technique has all the advantages in terms of flexibility of defining interconnection between embedded test access ports and maintaining synchronization between the test bus, the snoopy test access port and the embedded test access port of the test access port linking architecture TLA. This is a clear advantage over the other ad-hoc approaches described. This technique is compatible in pin requirements and in behavior with the JTAG standard. Thus the hierarchical test access port of this invention can be used with any existing TAPed core without requiring any modification to the existing core. Note that the existing test vectors for embedded cores do not need any change. Unlike the test access port linking architecture TLA, the hierarchical test access port of this invention does not require any dedicated handshake signals between the snoopy test access port and any of the embedded TAP controllers. Instead, all handshaking and passing of control happens via carefully chosen sequence of inputs on test mode select TMS, and setting of values in the control register and in the switch data register. Unlike the test access port linking architecture TLA, the hierarchical test access port of this invention also does not need a second test access port controller contained within the test access port linking module TLM.

Hierarchical use of hierarchical test access port of this invention is possible. The identical input/output pin requirements of the hierarchical test access port and the test access port specified in JTAG enables the hierarchical use illustrated in FIG. 14. The hierarchical test access port of this invention makes it possible to hierarchically connect up hierarchical test access ports and other JTAG compliant test access ports without the use of any explicit additional handshaking signals. The snoopy test access port controller is a JTAG compliant test access port controller, whose state diagram has been extended beyond that specified in JTAG to enable its role of snoopy gatekeeper. Perhaps The hierarchical test access port provides a fully hierarchical test access solution, that can be de-coupled from the design hierarchy in a completely flexible manner. In the first case, as an integrated circuit design becomes an embedded core, its hierarchical test access port could be simply retained. This would interface seamlessly to the hierarchical test access port inserted into the higher-level integrated circuit design. This corresponds to a compression of a board design into an integrated circuit. In the second case, it would be possible to design exactly one hierarchical test access port for use at all levels of the test-access hierarchy. This simplifies the design and test development process.

Real-life designs are expected to fall somewhere between these two extremes. For such designs, the designer will have the flexibility of choosing a configuration of hierarchical test access ports that is most appropriate for minimizing the area penalty, while minimizing the design time overhead due to insertion of test access circuitry, and the test development cost.

What is claimed is:

1. An electronic circuit comprising:
a first test access port including a predetermined set of input and output lines including a test data input line, said first test access port adapted for controlling electronic test of the electronic circuit and operating in accordance with a predetermined set of a plurality of test states, said predetermined set of test states including a data input state and an instruction input state;
a plurality of testable embedded core circuits each having a second test access port including said predetermined set of input and output lines adapted for controlling electronic test of said testable embedded core circuit, each second test access port operating in accordance with said predetermined set of a plurality of test states;
a test access port controller connected to said first test access port, said test access port controller including a switch data register loadable from said test data input line when said first test access port is in said at least one data input state;
a programmable switch coupled to said first test access port and said second test access port of each of said plurality of testable embedded core circuits, said programmable switch selectively connecting said first test access port to either no second test access port of any testable embedded core circuit or to said second test access port of a selected one of said at least one testable embedded core circuit for controlling test of said embedded core circuit dependent upon data stored in said switch data register; and
said test access port controller responsive to said test data input line when said programmable switch connects said first test access port to said second test access port of one of said plurality of testable embedded core circuits, said test access port controller operating in a one of a plurality of snoopy states corresponding to said test state of said second test access port, said test access port including a snoopy instruction register loadable from said test data input line when said test access port controller is in a snoopy state corresponding to an instruction input state of one of said plurality of testable embedded core circuits, said test access port controller controlling said programmable switch to disconnect said first test access port from said second test access port of all said at least one testable embedded core circuit when said snoopy instruction register stores a predetermined wake-up instruction.

2. The electronic circuit of claim 1, wherein:
said second test access port of each testable embedded core circuit includes an instruction register loadable from said test data input during said instruction input state;
said predetermined set of test states includes an update instruction register state for confirming update of data loaded into an instruction register;
said test access port controller controls said programmable switch to disconnect said first test access port from said second test access port of all said plurality of testable embedded core circuits when said snoopy instruction register stores said predetermined wake-up instruction in a snoopy state corresponding to said update instruction register state.

3. The electronic circuit of claim 1, wherein:
said second test access port of each of said plurality of testable embedded core circuits includes an instruction register loadable from said test data input during said instruction input state;
said snoopy instruction register of said test port controller includes more bits than said instruction register of said second test access port each of said plurality of testable embedded core circuits.

4. The electronic circuit of claim 3, wherein:
said predetermined set of test states includes an update instruction register state for confirming update of data loaded into an instruction register;
said test access port controller controls said programmable switch to disconnect said first test access port from said second test access port of all said plurality of testable embedded core circuits when said snoopy instruction register stores said predetermined wake-up instruction in a snoopy state corresponding to said update instruction register state.

5. The electronic circuit of claim 3, wherein:
said predetermined set of test states includes an update instruction register state for confirming update of data loaded into an instruction register;
said test access port controller further includes a counter for counting instruction bits received on said test data input line during a snoopy state corresponding to said instruction register input state; and
said test access port controller controls said programmable switch to disconnect said first test access port from said second test access port of all said plurality of testable embedded core circuits when a count in said counter exceeds a predetermined value in a snoopy state corresponding to said update instruction register state.

6. The electronic circuit of claim 5, wherein:
said test port access controller further includes a data register loadable in said data input state; and
said predetermined value is a value corresponding to a predetermined set of bits of said data register.

7. The electronic circuit of claim 1, further comprising:
at least one non-testable embedded core circuit not having a test port for controlling electronic test of said non-testable embedded core circuit; and
wherein said test access port controller is further connected to said at least one non-testable embedded core circuit and is further adapted for controlling test of said at least one non-testable embedded core circuit.

8. The electronic circuit of claim 1, wherein:
said electronic circuit including said first test access port, said at least one testable embedded core circuit, said test access port controller and said programmable switch is disposed upon a single integrated circuit.

9. A method of testing an integrated circuit comprising the steps of:
providing a first test access port having a predetermined set of input and output lines including a test data input line, said first test access port adapted for controlling electronic test of the electronic circuit and operating in accordance with a predetermined set of a plurality of test states, said predetermined set of test states including a data input state and an instruction input state;
embodying in the integrated circuit a plurality of testable embedded core circuits each having a second test access port including said predetermined set of input and output lines adapted for controlling electronic test of said testable embedded core circuit, each second test access port operating in accordance with said predetermined set of a plurality of test states;
embodying in the integrated circuit a test access port controller connected to said first test access port, said test access port controller including a switch data register loadable from said test data input line when said first test access port is in said at least one data input state;

embodying in the integrated circuit a programmable switch coupled to said first test access port and said second test access port of each of said at least one testable embedded core circuit, said programmable switch selectively connecting said first test access port to either said second test access port of no testable embedded core circuit or to said second test access port of a selected one of said plurality of testable embedded core circuits for controlling test of said embedded core circuit dependent upon data stored in said switch data register; and said test access port controller responsive to said test data input line when said programmable switch connects said first test access port to said second test access port of one of said plurality of testable embedded core circuits, said test access port controller operating in a one of a plurality of snoopy states corresponding to said test state of said second test access port, said test access port including a snoopy instruction register loadable from said test data input line when said test access port controller is in a snoopy state corresponding to an instruction input state of one of said testable embedded core circuits, said test access port controller controlling said programmable switch to disconnect said first test access port from said second test access port of all said plurality of testable embedded core circuits when said snoopy instruction register stores a predetermined wake-up instruction.

10. The method of claim 9, further comprising the steps of:

loading an instruction register of said second test access port of said one of said plurality of testable embedded core circuit connected to said first test access port from said test data input during said instruction input state;

wherein said predetermined set of test states includes an update instruction register state for confirming update of data loaded into an instruction register; and controlling said programmable switch to disconnect said first test access port from said second test access port of all said plurality of testable embedded core circuits when said snoopy instruction register stores said predetermined instruction in a snoopy state corresponding to said update instruction register state.

11. The method of claim 9, further comprising the steps of:

loading an instruction register of said second test access port of said one of said plurality of testable embedded core circuit connected to said first test access port from said test data input during said instruction input state; and wherein said snoopy instruction register of said test port controller includes more bits than said instruction register of said second test access port each of said plurality of testable embedded core circuits.

12. The method of claim 11, wherein:

said predetermined set of test states includes an update instruction register state for confirming update of data loaded into an instruction register; and said method further includes the step of controlling said programmable switch to disconnect said first test access port from said second test access port of all said plurality of testable embedded core circuits when said snoopy instruction register stores said predetermined wake-up instruction in a snoopy state corresponding to said update instruction register state.

13. The method of claim 12, wherein:

said predetermined set of test states includes an update instruction register state for confirming update of data loaded into an instruction register;

said test access port controller further includes a counter for counting instruction bits received on said test data input line during said snoopy instruction register input state; and said method further includes the step of controlling said programmable switch to disconnect said first test access port from said second test access port of all said plurality testable embedded core circuits when a count in said counter exceeds a predetermined value in a snoopy state corresponding to said update instruction register state.

14. The method of claim 13, further comprising the step of:

loading a data register of said test port access controller in said data input state; and wherein said predetermined value is a value corresponding to a predetermined set of bits of said data register.

15. The method of claim 9, further comprising the steps of:

embodying in said integrated circuit at least one non-testable embedded core circuit not having a test port for controlling electronic test of said non-testable embedded core circuit; and controlling test of said at least one non-testable embedded core circuit via said test access port controller.

16. The method of claim 9, further comprising the steps of:

testing said integrated circuit by sequentially for each testable embedded core circuit
controlling said programmable switch to connect said second test access port of one of said plurality of testable embedded core circuits to said first test access port,
supplying said corresponding test vector to said first test access port,
supplying data on said test data input line of said first test access port to load said predetermined wake-up instruction into said snoopy instruction register when in a snoopy state corresponding to said instruction input state,
controlling said programmable switch to disconnect said second test port of all of said plurality of testable embedded core circuits from said first test access port, and
supplying data on said test data input line of said first test access port to change said internal state of said test access port controller to load said switch data register with data to control said programmable switch to connect said second test access port of a next one of said plurality of testable embedded core circuits until all testable embedded core circuits are tested.

* * * * *